(12) United States Patent
Takafuji et al.

(10) Patent No.: US 8,563,406 B2
(45) Date of Patent: Oct. 22, 2013

(54) SEMICONDUCTOR SUBSTRATE, SEMICONDUCTOR DEVICE, AND MANUFACTURING METHODS FOR THEM

(75) Inventors: Yutaka Takafuji, Nara (JP); Yasumori Fukushima, Sakurai (JP); Masao Moriguchi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 568 days.

(21) Appl. No.: 12/416,240

(22) Filed: Apr. 1, 2009

(65) Prior Publication Data

US 2009/0191671 A1 Jul. 30, 2009

Related U.S. Application Data

(62) Division of application No. 11/086,680, filed on Mar. 23, 2005, now Pat. No. 7,528,446.

(30) Foreign Application Priority Data

Mar. 26, 2004 (JP) ................................. 2004-093694

(51) Int. Cl.
*H01L 21/322* (2006.01)
(52) U.S. Cl.
USPC 438/473; 257/347; 257/E21.32; 257/E21.413
(58) Field of Classification Search
USPC ................. 257/59, 347, E21.32, E21.413; 438/149, 164, 166, 473, 486
See application file for complete search history.

(56) References Cited

U.S. PATENT DOCUMENTS 5,528,054 A 6/1996 Ipposhi et al.
5,776,789 A 7/1998 Nakamura
5,815,223 A 9/1998 Watanabe et al.
6,316,333 B1 11/2001 Bruel et al.
6,472,703 B1 10/2002 Nakamura
(Continued)

FOREIGN PATENT DOCUMENTS

EP 1 526 567 4/2005
JP 7-161947 A 6/1995
(Continued)

OTHER PUBLICATIONS

Salerno, "Single Crystal Silicon AMLCDs", 1994, pp. 39-44.
(Continued)

*Primary Examiner* — David Vu
(74) *Attorney, Agent, or Firm* — Nixon & Vanderhye P.C.

(57) ABSTRACT

The present invention provides a semiconductor substrate, which comprises a singlecrystalline Si substrate which includes an active layer having a channel region, a source region, and a drain region, the singlecrystalline Si substrate including at least a part of a device structure not containing a well-structure or a channel stop region; a gate insulating film formed on the singlecrystalline Si substrate; a gate electrode formed on the gate insulating film; a LOCOS oxide film whose thickness is more than a thickness of the gate insulating film, the LOCOS oxide film being formed on the singlecrystalline Si substrate by surrounding the active layer; and an insulating film formed over the gate electrode and the LOCOS oxide film. On this account, on fabricating the semiconductor device having a high-performance integration system by forming the non-singlecrystalline Si semiconductor element and the singlecrystalline Si semiconductor element on the large insulating substrate, the process for making the singlecrystalline Si is simplified. Further, the foregoing arrangement provides a semiconductor substrate and a fabrication method thereof, which ensures device isolation of the minute singlecrystalline Si semiconductor element without highly-accurate photolithography, when the singlecrystalline Si semiconductor element is transferred onto the large insulating substrate.

6 Claims, 11 Drawing Sheets

(56) References Cited

U.S. PATENT DOCUMENTS

| | | |
|---|---|---|
| 6,583,474 B2 | 6/2003 | Yamazaki et al. |
| 6,831,322 B2 | 12/2004 | Nakamura |
| 2002/0001913 A1 | 1/2002 | Kim |
| 2002/0056866 A1 | 5/2002 | Nakamura |
| 2003/0183876 A1 | 10/2003 | Takafuji et al. |
| 2004/0061176 A1 | 4/2004 | Takafuji et al. |
| 2005/0040451 A1 | 2/2005 | Nakamura |
| 2005/0087739 A1 | 4/2005 | Ogawa et al. |
| 2006/0084226 A1 | 4/2006 | Nakamura |
| 2007/0063281 A1 | 3/2007 | Takafuji et al. |
| 2007/0176221 A1 | 8/2007 | Nakamura |

FOREIGN PATENT DOCUMENTS

| | | | |
|---|---|---|---|
| JP | 9-55484 A | | 2/1997 |
| JP | 9-74202 A | | 3/1997 |
| JP | 10-125880 A | | 5/1998 |
| JP | 10-125881 A | | 5/1998 |
| JP | 11-297972 A | | 10/1999 |
| JP | 2000-150633 | | 5/2000 |
| JP | 2001-508943 A | | 7/2001 |
| JP | 3371756 B2 | | 11/2002 |
| JP | 2003-282885 A | | 10/2003 |
| WO | 93/15589 A1 | | 8/1993 |

OTHER PUBLICATIONS

Tong et al, "Semiconductor Wafer Bonding: Science and Technology", John Wiley & Sons, Inc., 1999, pp. v-xi, 8-13 and 86-87.

Warner et al, "Low-Temperature Oxide-Bonded Three-Dimensional Integrated Circuits", 2002 IEEE International SOI Conference, Oct. 2002, pp. 123-125.

Allen et al, "SOI Uniformity and Surface Smoothness Improvement Using GCIB Processing", 2002 IEEE International SOI Conference, Oct. 2002, pp. 192-193.

"Transferred-Silicon AMLCDs", Werner, Information Display Oct. 1993, pp. 21-23; XP-000827812.

Office Action mailed Oct. 16, 2006 in U.S. Appl. No. 11/086,680.
Office Action mailed Jan. 26, 2007 in U.S. Appl. No. 11/086,680.
Office Action mailed Aug. 1, 2007 in U.S. Appl. No. 11/086,680.
Advisory Action mailed Nov. 8, 2007 in U.S. Appl. No. 11/086,680.
Office Action mailed Feb. 6, 2008 in U.S. Appl. No. 11/086,680.
Office Action mailed Aug. 8, 2008 in U.S. Appl. No. 11/086,680.
Advisory Action mailed Oct. 20, 2008 in U.S. Appl. No. 11/086,680.
Notice of Allowance mailed Jan. 28, 2009 in U.S. Appl. No. 11/086,680.
Office Action mailed May 11, 2012 in U.S. Appl. No. 13/150,620 (14 pages).

☒ CONTACT HOLE

SEMICONDUCTOR SUBSTRATE, SEMICONDUCTOR DEVICE, AND MANUFACTURING METHODS FOR THEM

CROSS REFERENCE TO RELATED APPLICATIONS

This application is a divisional of U.S. application Ser. No. 11/086,680, filed Mar. 23, 2005 now U.S. Pat. No. 7,528,446, which claims priority under 35 U.S.C. §119(a) on Patent Application No. 2004/93694 filed in Japan on Mar. 26, 2004, the entire contents of which are hereby incorporated by reference.

FIELD OF THE INVENTION

The present invention relates to a semiconductor substrate and a semiconductor device used for an active matrix liquid crystal display device that is driven by TFTs (Thin Film transistor), such as a high-functional liquid crystal display device, an OLED (Organic Light Emitting Diode: Organic EL) display device or the like, in which the peripheral circuits, the control circuit, the MPU (Micro Processing Unit), and/or the image processing circuit are all integrated into a single substrate. The present invention also provides fabrication method for the semiconductor substrate/device.

The present invention particularly relates to a system-on-panel technology that offers great improvement of circuit performance with the use of singlecrystalline thin film device, the fabrication method thereof, a device structure for making the semiconductor device using the technology, and a fabrication method for realizing coexistence of a singlecrystalline device and a non-singlecrystalline device, a polycrystalline Si in particular.

Further, the present invention enables formation of two types of semiconductor device with different characteristics, allowing efficient use of respective benefits of those devices, thereby the resulting product is applicable not only to a display device but also to other various purposes. The present invention is particularly applicable to a semiconductor substrate and a semiconductor device used for an active matrix liquid crystal display device driven by TFTs (Thin Film transistor), such as a high-functional liquid crystal display device or an OLED (Organic Light Emitting Diode: Organic EL) display device, in which the peripheral circuits, the control circuit, or the MPU (Micro Processing Unit), and/or the image processing circuit are all integrated into a single substrate.

BACKGROUND OF THE INVENTION

A display device driven by so-called an active matrix manner has come into practical use, and the production amount is increasing. To carry out the active matrix driving, a liquid crystal display panel or an organic EL panel is driven with a Thin Film Transistor (hereinafter referred to as a TFT), which is made of an amorphous Si (hereinafter referred to as an a-Si) or a polycrystalline Si (hereinafter referred to as a Poly-Si), and is formed on the glass substrate as a switching element of the pixel.

Particularly, with the use of Poly-Si which has high carrier mobility and allows high-speed operation, recent technologies have succeeded to integrate even the peripheral drivers etc. onto a glass substrate. Such a structure has been manufactured as a product.

However, in such a display device, like a liquid crystal display device or an OLED (Organic Light Emitting Diode: organic EL) using a large glass substrate, there is some problems in using a driver IC including a transistor made of a non-singlecrystalline Si, particularly a poly-Si, because of the variation in characteristics due to the particular crystal grain boundaries of poly-Si and poor quality of gate insulating film, thereby disabling the transistor to be adopted for integration of a complex system. In this view, and also considering display quality (uniformity), a device with higher performance and less characteristic variation is required.

Particularly, when a highly-integrated semiconductor device is directly mounted to a display substrate, or on systematization thereof, there are difficulties to ensure high-speed performance and high integration density because of insufficiencies in driving speed, micro fabrication, and device performance (mobility, control of the threshold, sharpness of transmission characteristic). The foregoing structure is therefore insufficient in device performance and integration density to realize a desired system integration in a driving system used for an image processor or a timing controller, which requires a superior-performance.

Accordingly, there is a serious difficulty in fabrication of pixel TFTs and a high-performance/high-density driver for driving the pixel TFTs directly onto a large display substrate, of a glass or the like.

To overcome this problem, there is a technology of mounting (assembling) a singlecrystalline Si driver LSI (Large Scale Integrated circuit) using a COG (Chip On Glass), in which an LSI, formed from a singlecrystalline Si, is assembled onto a display substrate through, for example, flip-chip bonding with an anisotropic conductive film etc.

Since a general LSI includes MOS (Metal Oxide Semiconductor) transistors formed from bulk singlecrystalline Si, the individual transistor needs to be driven separately to ensure adequate operation. Therefore, to separate the transistors into individual pieces (device isolation), or to prevent latch-up by a parasitic bipolar transistor, ion implantation, such as channel stop implantation section 101 or multiple well 102, is performed as shown in FIG. 13. However, the trend of miniaturization of transistor arises a new problem regarding the area for device isolation. Thus, to reduce the area for device isolation, retrograde well (reverse-impurity concentration gradient-well) structure or the like has been introduced; however, this structure requires ion implantation many times and makes the process complicated, thus causing a cost rise and a decrease in yield. Further, requirement of processes for forming bumps etc. increases time for fabrication, thereby decreasing the yield.

Further, in manufacturing a liquid crystal display device or an OLED display device, there are some restrictions, for example, the driver IC needs to be assembled onto a completed panel. This arises various problems, such as less-flexible and complicated manufacturing, low efficiency in distribution and manufacturing, and a cost rise which causes a decrease in yield.

This problem can be solved by device transfer. In the device transfer, a device made of a singlecrystalline Si is formed on a bulk Si substrate, and is bonded to a glass substrate to create a display panel, and the insulator is then separated from the device layer through some kind of exfoliation. Note that, this structure in which a device of a singlecrystalline Si is formed on an insulator is called a SOI (Silicon On Insulator).

A possible method of performing the device transfer is removing an oxide film under the singlecrystalline Si from the SOI structure by etching so as to create a thin film device (Kopin Co. Ltd.) This method are described in detail, for example in Japanese Laid-Open Patent Application Tokuhyohei 07-503557 (published on Apr. 13, 1995), and the following Documents 1 and 2.

Document 1: J. P. Salerno "Single Crystal Silicon AMLCDs", Conference Record of the 1994 International Display Research Conference (IDRC) p. 39-44 (1994)

Document 2: Q.-Y. Tong & U. Gesele, SEMICONDUCTOR WAFER BONDING: SCIENCE AND TECHNOLOGY_, John Wiley & Sons, New York (1999)

Tokuhyohei 07-503557 discloses a method of manufacturing a display panel for an active matrix-type liquid crystal display device, using a semiconductor device on which a singlecrystalline Si thin film transistor is transferred, the transfer is formed on a glass substrate in advance with an adhesive.

Further, other prior arts of the present invention can be found in Japanese Laid-Open Patent Application Tokukaihei 10-125880 (published on May 15, 1998), and the following Documents 3 and 4.

Document 3 K. Warner, et. al., 2002 IEEE International SOI Conference: October, pp. 123-125 (2002)

Document 4 L. P. Allen, et. al., 2002 IEEE International SOI Conference: October, pp. 192-193 (2002)

Tokukaihei 10-125880 discloses a method of first creating level differences in the singlecrystalline Si, forming a small polishing stopper whose polishing rate is smaller than the singlecrystalline Si, then transferring the Si onto another Si substrate, and polishing the divided surface. By thus forming the stopper in a concave section of the step and using the difference in polishing speed, this method makes an island-shaped singlecrystalline Si thin film.

However, the conventional semiconductor substrates, and semiconductor devices, and fabrication methods for those have the following disadvantages.

First, in a SOI structure, since the devices are formed on a silicon wafer, the total size of all devices to be provided thereon needs to fall within the silicon (Si) wafer. The size of silicon (Si) wafer is limited, and may be smaller than a large glass substrate in some cases.

Further, since a singlecrystalline Si device formed on the silicon (Si) wafer is bonded onto a glass substrate with an adhesive of, for example, an epoxy resin, there are certain difficulties to additionally performing a defect recovery thermal process (Annealing process), an inter-layer insulating film forming process, or a metal-wiring forming process after the bonding. Therefore, there is a serious difficulty in connecting between the device formed in advance on a large glass substrate, and a singlecrystalline Si device transferred onto the glass substrate through mutual wiring.

Further, this method is more complicated as it first forms an operation region on a solid phase epitaxial film, which is a singlecrystalline layer of a thin film grown on a silicon dioxide ($SiO_2$), to make a singlecrystalline Si device, and then the silicon dioxide ($SiO_2$) is divided by etching. Therefore, this method suffers from a decrease in yield (transfer process, division/retention of thin film, epitaxial growth).

SUMMARY OF THE INVENTION

An object of the present invention is to provide a semiconductor substrate and a semiconductor device for realizing a semiconductor device having a high-performance integrated system in which a non-singlecrystalline Si semiconductor element and a singlecrystalline Si semiconductor element are formed on a large insulating substrate. The semiconductor substrate/device of the present invention uses a simple method for forming the singlecrystalline Si portion, and ensures device isolation of a minute singlecrystalline Si semiconductor element without highly-accurate photolithography, when the semiconductor substrate is transferred onto a large insulating substrate. The present invention also provides fabrication methods of the semiconductor substrate/device.

In order to solve the foregoing problems, the semiconductor substrate according to the present invention comprises: a singlecrystalline Si substrate which includes an active layer having a channel region, a source region, and a drain region, the singlecrystalline Si substrate including at least a part of a device structure not containing a well-structure or a channel stop region; a gate insulating film formed on the singlecrystalline Si substrate; a gate electrode formed on the gate insulating film; a LOCOS oxide film whose thickness is more than a thickness of the gate insulating film, the LOCOS oxide film being formed on the singlecrystalline Si substrate by surrounding the active layer; and an insulating film formed over the gate electrode and the LOCOS oxide film.

Further, in order to solve the foregoing problems, a fabrication method of a semiconductor substrate according to the present invention comprises the steps of: (i) forming a LOCOS oxide film outside a device area of a singlecrystalline Si substrate; (ii) forming a gate insulating film in the device area of the singlecrystalline Si substrate; (iii) selectively implanting impurity into the device area of the singlecrystalline Si substrate so as to form a source region, a drain region and a channel region which together constitute an active layer; (iv) forming an insulating film with a flat upper surface over the gate electrode, the gate insulating film, and the LOCOS oxide film; and (v) implanting through the insulating film one or plural kinds of ion selected from a hydrogen ion group or an inactive element ion group so as to form an ion implantation layer with a predetermined depth in the singlecrystalline Si substrate.

Further, in order to solve the foregoing problems, a fabrication method of a semiconductor substrate according to the present invention comprises the steps of: (i) forming a LOCOS oxide film outside a device area of a singlecrystalline Si substrate; (ii) forming a gate insulating film in the device area of the singlecrystalline Si substrate; (iii) selectively implanting impurity into the device area of the singlecrystalline Si substrate so as to form a source region, a drain region and a channel region which together constitute an active layer; (iv) forming a first insulating film with a flat upper surface over the gate electrode, the gate insulating film, and the LOCOS oxide film; (v) implanting through the first insulating film one or plural kinds of ion selected from a hydrogen ion group or an inactive element ion group so as to form an ion implantation layer with a predetermined depth in the singlecrystalline Si substrate; (vi) forming at least one first wiring layer above the first insulating film; and (vii) forming a second insulating film on the first wiring layer.

In the semiconductor substrate according to the present invention, the semiconductor device, and the fabrication methods of those according to the present embodiment, there is provided an active layer having a channel region, a source region, and a drain region; and the singlecrystalline Si substrate includes at least a part of a device structure not containing a well-structure or a channel stop region.

With this arrangement using a singlecrystalline Si, the resulting semiconductor device is superior in performance and less varied in characteristic.

Further, in this structure not providing a conventional well, a channel stop, or a well-contact, the area of the device area is reduced, allowing more dense integration, thereby realizing a highly-dense semiconductor substrate. Further, since the conventional well is omitted, the device may be made thinner than the conventional structure using a well. Thus, the semiconductor element can be made as a thin film which can coexist with the TFTs formed from other polycrystalline Si upon formation of the semiconductor device, allowing conduction between the semiconductor element and TFTs through common thin film wiring. Further, since the element can be isolated by etching back the Si thin film, which is created as a result of the cleavage, it is possible to ensure the device isolation of the minute singlecrystalline Si device even on the insulating substrate 25, such as a large glass substrate, without highly-accurate photolithography. Further, since the well is omitted, the fabrication process is simplified.

Further, in the present embodiment, the LOCOS oxide film, thicker than the gate insulating film, is formed by surrounding the active layer. This LOCOS oxide film securely ensures the device isolation.

On this account, on fabricating the semiconductor device having a high-performance integration system by forming the non-singlecrystalline Si semiconductor element and the singlecrystalline Si semiconductor element on the large insulating substrate, the process for making the singlecrystalline Si is simplified. Further, the foregoing arrangement provides a semiconductor substrate and a fabrication method thereof, which ensures device isolation of the minute singlecrystalline Si semiconductor element without highly-accurate photolithography, when the singlecrystalline Si semiconductor element is transferred onto the large insulating substrate.

Further, in order to solve the foregoing problems, a semiconductor device according to the present invention includes an insulating substrate, and a singlecrystalline Si semiconductor element formed on the insulating substrate, the singlecrystalline Si semiconductor element comprising: a gate electrode formed above the insulating substrate; a gate insulating film formed on the gate electrode; an active layer, which is formed on the gate insulating film and is made of a singlecrystalline Si layer having a channel region, a source region, and a drain region; a LOCOS oxide film formed around the active layer; and an interlayer insulating film formed over the active layer and the LOCOS oxide film.

In the foregoing arrangement, the semiconductor device includes the insulating substrate, and a singlecrystalline Si semiconductor element formed on the insulating substrate. The semiconductor device is realized by, for example, a glass insulating substrate and a singlecrystalline Si semiconductor element combined together.

Further, the singlecrystalline Si semiconductor element comprises a gate electrode formed above the insulating substrate; a gate insulating film formed on the gate electrode; an active layer, which is formed on the gate insulating film and is made of a singlecrystalline Si layer having a channel region, a source region, and a drain region; a LOCOS oxide film formed around the active layer; and an interlayer insulating film formed over the active layer and the LOCOS oxide film.

On this account, on fabricating the semiconductor device having a high-performance integration system by forming the non-singlecrystalline Si semiconductor element and the singlecrystalline Si semiconductor element on the large insulating substrate, the process for making the singlecrystalline Si is simplified. Further, the foregoing arrangement provides a semiconductor substrate and a fabrication method thereof, which ensures device isolation of the minute singlecrystalline Si semiconductor element without highly-accurate photolithography, when the singlecrystalline Si semiconductor element is transferred onto the large insulating substrate.

Further, the semiconductor device according to the present invention includes a wiring layer, which is formed on the interlayer insulating film and is connected to the source and drain regions via through holes formed in the interlayer insulating film.

Further, in order to solve the foregoing problems, a fabrication method of a semiconductor device according to the present invention comprises the steps of: (a) bonding a semiconductor substrate, which was fabricated by the manufacturing method of the semiconductor substrate according to the present invention, onto an insulating substrate; (b) dividing the singlecrystalline Si substrate at the ion implantation layer by heat treatment so as to detach a part of the singlecrystalline Si substrate; (c) etching a part of singlecrystalline Si on the insulating substrate so as to expose a surface of the LOCOS oxide film; (d) forming an interlayer insulating film over the active layer and the LOCOS oxide film; and (e) forming a wiring layer on the interlayer insulating film, and connecting the wiring layer to the source and drain regions via through holes, which is formed in the interlayer insulating film.

With this method, the semiconductor device is provided with a wiring layer, which is formed on the interlayer insulating film and is connected to the source and drain regions via through holes formed in the interlayer insulating film.

With this arrangement, the semiconductor device is conducted to other circuits, power supply etc. through this metal wiring layer. Further, the metal wiring layer can be formed after the semiconductor substrate having the singlecrystalline Si semiconductor element is bonded to the insulating substrate.

On this account, on fabricating the semiconductor device having a high-performance integration system by forming the non-singlecrystalline Si semiconductor element and the singlecrystalline Si semiconductor element on the large insulating substrate, the process for making the singlecrystalline Si is simplified. Further, the foregoing arrangement provides a semiconductor substrate and a fabrication method thereof, which ensures device isolation of the minute singlecrystalline Si semiconductor element without highly-accurate photolithography, when the singlecrystalline Si semiconductor element is transferred onto the large insulating substrate.

Further, in order to solve the foregoing problems, a semiconductor device according to the present invention includes an insulating substrate, and a singlecrystalline Si semiconductor element formed on the insulating substrate, the singlecrystalline Si semiconductor element comprising: a gate electrode formed above the insulating substrate; a gate insulating film formed on the gate electrode; an active layer, which is formed on the gate insulating film and is made of a singlecrystalline Si layer having a channel region, a source region, and a drain region; a LOCOS oxide film formed around the active layer; a interlayer insulating film formed over the active layer and the LOCOS oxide film; an insulating film formed between the insulating substrate and the gate electrode; at least one first wiring layer formed beneath the insulating film; and a second wiring layer, which is formed on the interlayer insulating film and is connected to the first wiring layer.

Further, in order to solve the foregoing problems, fabrication method of a semiconductor device according to the present invention, comprising the steps of: (a) bonding a semiconductor substrate, which was fabricated by the manufacturing method of the semiconductor substrate according to the present invention, onto an insulating substrate; (b) dividing the singlecrystalline Si substrate at the ion implantation layer by heat treatment so as to detach a part of the singlecrystalline Si substrate; (c) etching a part of singlecrystalline Si on the insulating substrate so as to expose a surface of the LOCOS oxide film; (d) forming an interlayer insulating film over the active layer and the LOCOS oxide film; and (e) forming a second wiring layer on the interlayer insulating film, and connecting the second wiring layer to the first wiring layer.

On forming the first metal wiring, it is generally required to form a plurality of wiring layers for efficient use of space, in order to increase the integration density of the IC. However, this results from difficulty in providing wiring pattern in actual manufacturing due to the small element region.

In view of this problem, the semiconductor device of the present invention includes at least one first wiring layer formed beneath the insulating film; and a second wiring layer, which is formed on the interlayer insulating film and is connected to the first wiring layer.

On this account, it is possible to use space on the rear side of the device area, allowing efficient leading of wiring, thereby increasing integration density.

Additional objects, features, and strengths of the present invention will be made clear by the description below. Further, the advantages of the present invention will be evident from the following explanation in reference to the drawings.

DESCRIPTION OF THE EMBODIMENTS

[Referential Embodiment]

Before the explanation of the present embodiment, the following describes a technology suggested in an unpublished patent application, which is made by the same inventor prior to the present invention, aimed at solving the conventional problems.

First, the conventional problems are summarized below.

In a SOI (Silicon On Insulator) structure, since the devices are formed on a silicon (Si) wafer, the total size of all devices to be provided thereon needs to fall within the silicon (Si) wafer. However, the size of silicon (Si) wafer is limited, and may be smaller than a large glass substrate.

Moreover, since a singlecrystalline Si device formed on the silicon (Si) wafer is bonded onto a glass substrate with an adhesive of, for example, an epoxy resin, there are serious difficulties to additionally performing a defect recovery thermal process (Annealing process), an inter-layer insulating film forming process, or a metal-wiring forming process, after the bonding. Therefore, there is a serious difficulty in connecting between the device formed in advance on a large glass substrate, and a singlecrystalline Si device transferred onto the glass substrate, using mutual wiring.

Further, this method is complicated, as it first forms an operation region on a solid phase epitaxial film, which region is a singlecrystalline layer of a thin film grown on a silicon dioxide ($SiO_2$) to become a singlecrystalline Si device, and then the silicon dioxide ($SiO_2$) is divided by etching. Therefore, this method arises a problem of decrease in yield (transfer process, division/retention of thin film, epitaxial growth).

Figure 12:
FIGS. 12(a) through 12(i) are cross sectional views illustrating manufacturing processes of a semiconductor device.
Figure 12:
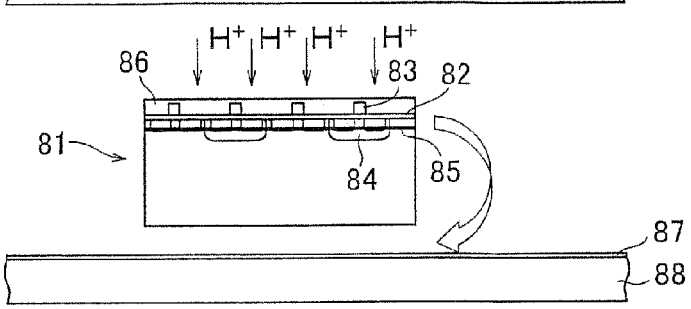
Figure 12:
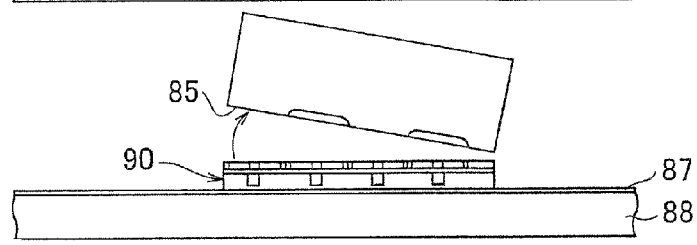
Figure 12:
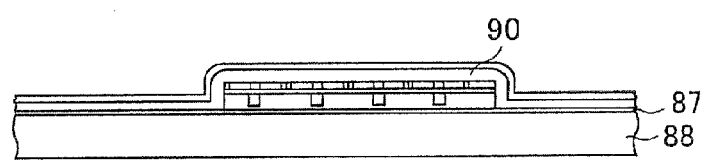
Figure 12:
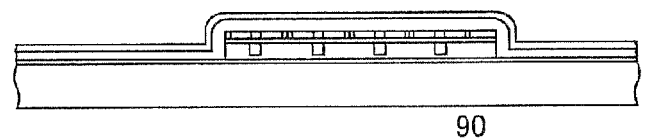
Figure 12:
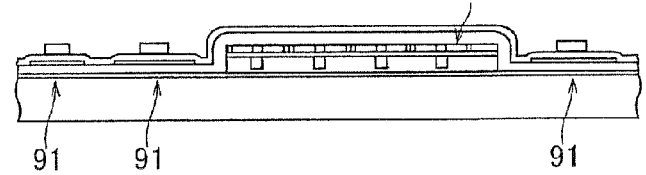
Figure 12:
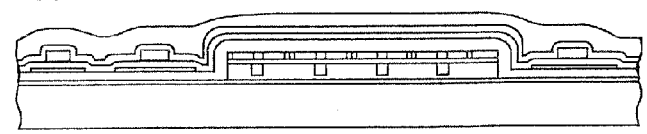
Figure 12:
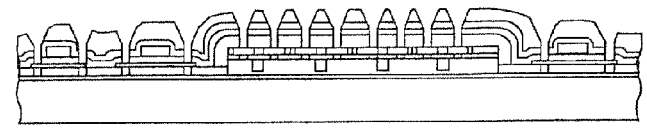
Figure 12:
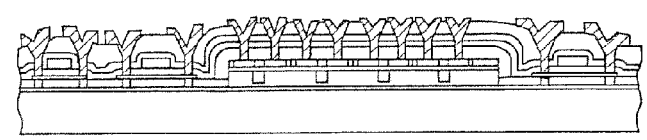
Figure 13:
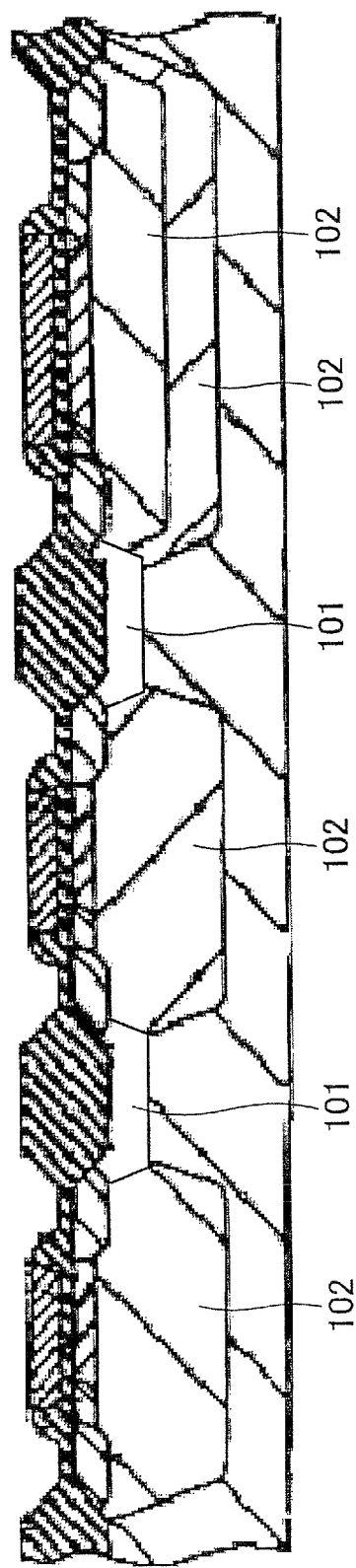
FIG. 13 is a cross-sectional view illustrating a conventional semiconductor device of a well-structure.

In view of this problem, as shown in FIGS. 12(a) through 12(c), the inventors, and other researches concerning the invention made a fabrication method of a semiconductor device, which is detailed below. First, the main process for creating a transistor is performed by forming a gate electrode 83, an impurity doped portion 84, and a gate insulating film 82 on a singlecrystalline Si substrate 81 through micro-fabrication. Next, hydrogen ion of a predetermined concentration is implanted into the substrate with a predetermined depth so as to form an ion implantation section 85. An oxide film 86 is formed on the surface and is then flattened by CMP (Chemical Mechanical Polishing). Then, the singlecrystalline Si substrate 81 is cut into a predetermined-shape, and is brought into contact with a glass substrate 88, which is thereon provided with a $SiO_2$ film 87 by a plasma CVD using TEOS (Si $(OC_2H_5)_4$: Tetra Ethyl Ortho Silicate) and having been activated by an SC1 cleaning solution or the like, so that the singlecrystalline Si substrate 81 and the glass substrate 88 are bonded.

Next, the two mated substrates are heated to grow a Platelet, which contains hydrogen gas, in the hydrogen ion implantation section 85, the Platelet is then separated as a thin film of a singlecrystalline Si device 90. As a result, as shown in FIGS. 12(d) through 12(i), the singlecrystalline Si device 90 and a non-singlecrystalline Si TFT 91 coexist.

With this structure, this invention provides means to solve the conventional size restriction depending on the size of Si wafer.

Further, since this method also allows omission of the step of forming a solid phase epitaxial film on the silicon dioxide ($SiO_2$), it is also possible to solve the defects of increase in time of fabrication, complication of fabrication and a decrease in yield (transfer process, division/retention of thin film, epitaxial growth) arisen in the conventional method, which first forms an operation region on a solid phase epitaxial film, which is a singlecrystalline layer of a thin film grown on a silicon dioxide ($SiO_2$) to become a singlecrystalline Si device, and then divides the silicon dioxide ($SiO_2$) by etching.

However, to realize high-density integration of the singlecrystalline thin film transistor Si while ensuring sufficiently high performance, there are some more problems yet to be overcome as detailed below.

Specifically, to form a singlecrystalline Si device on a large glass substrate, it is necessary to perform device isolation; however, the etching of the singlecrystalline Si into an island-shape described in the foregoing method is practically impossible due to restriction of photolithography with a large glass substrate.

Further, when the singlecrystalline Si is eventually transferred onto an insulating substrate such as a glass substrate so as to form a device, the singlecrystalline Si becomes a thin film. Therefore, it is not necessary to create a complex well structure or to perform doping process for making, channel stop etc., which are required for a general bulk singlecrystalline Si LSI; however, there still are problems regarding device isolation, recovery of surface damage after creating a thin film, solution for realizing the short channel. Thus, it is necessary to create a new fabrication method or a new device structure to solve those problems.

Further, there is another method in which hydrogen ion or the like is implanted into a portion of a Si substrate on which a part of the singlecrystalline Si device is formed, and the singlecrystalline Si device is cut into a thin film by being divided at the ion implantation portion. In addition to the above-mentioned problem, this method further has inadequacies in device isolation (defective Si island's end in island etching) and reduction in stress leakage current.

The following describes the embodiments of the present invention which overcome the problems above.

[First Embodiment]

One embodiment of the present invention is described below with reference to FIGS. 1 through 7.

Note that, the semiconductor substrate and the semiconductor device according to the present embodiment provide improved performance and improved functionality on account of a structure in which a MOS non-singlecrystalline Si thin film transistor and a MOS singlecrystalline Si thin film transistor are formed in different regions of an insulating substrate, such as a glass substrate. This semiconductor device is to be mounted to an active matrix substrate using TFTs (Thin Film Transistor).

The MOS thin film transistor is a general transistor comprising an active layer, a gate electrode, a gate insulating film, and a high concentration impurity doped portion (source/drain electrodes) formed on each side of the gate, wherein the gate electrode controls the carrier density of the semiconductor layer under the gate, so as to control a flow of source-drain current.

As one of the characteristics, the MOS transistor, when arranged as a CMOS (Complementary MOS) structure, consumes less power, and produces full output according to the power voltage. With this advantage, the MOS transistor is suitable for a low power consumption logic device. The present embodiment assumes a CMOS (Complementary MOS), but only one MOS (Metal Oxide Semiconductor) is illustrated in the accompanied figures.

Figure 1:
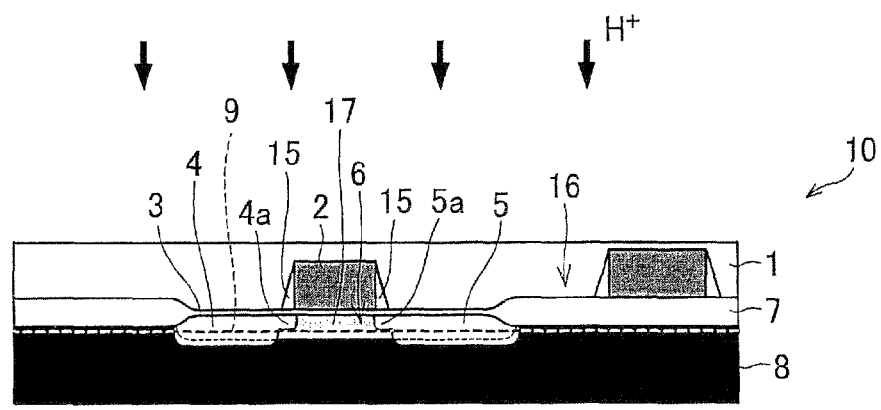
FIG. 1 is a cross-sectional view illustrating one embodiment of a semiconductor substrate according to the present invention.

As shown in FIG. 1, the semiconductor substrate 10 according to the present embodiment includes a singlecrystalline silicon (Si) wafer (Singlecrystalline Si wafer, hereinafter) 8 which is provided as a singlecrystalline Si substrate including neither well-structure nor channel stop structure; a gate insulating film 3 formed on the singlecrystalline Si wafer 8; a gate electrode 2 formed on the gate insulating film 3; and a LOCOS (Local Oxidation of Silicon: Selective Oxidation) oxide film 7; and a planarization insulating film 1 formed as an insulating film over the LOCOS oxide film 7 and the gate electrode 2. The singlecrystalline silicon wafer 8 includes an active layer 6 which has a channel region 17, and source/drain regions 4 and 5. The LOCOS oxide film 7 is formed on the singlecrystalline Si wafer 8 around the active layer 6, and has a thickness greater than the gate insulating film 3.

Further, for threshold control, the active layer 6 has N+ or P+ impurity implantation portion, where the source region 4 and the drain region 5 are formed. These impurity portions are formed in a device area in which a shallow reverse-conductive impurity is doped.

More specifically, in the semiconductor substrate 10 according to the present embodiment, the singlecrystalline Si wafer 8 is provided with a LDD (Lightly Doped Drain) structure (4a/5a), or implantation (doping) of either Pocket or Halo as a solution for realizing the short channel. However, aside from these implantations, there is no more ion implantations is required, such as implantation for well structure or channel stop; also, the well contact is not made.

The oxide film 1, with a flat surface, is formed of a silicon dioxide ($SiO_2$) film, a phosphorous silicate glass (PSG) film or a borophospho-silicate glass (BPSG) film, for example. Further, in a general LSI, the LOCOS film is provided as one of the means for device isolation. The LOCOS film is usually formed as a thick thermal oxide film (field oxide film) around the active layer 6 so as to function as a thick insulating film for the gate electrode running across the field section, thereby increasing the threshold voltage of a parasitic transistor generated in the portion. In this way, the LOCOS film serves to isolate elements into separate areas, thus ensuring device isolation.

In the present embodiment, the thickness of the LOCOS oxide film 7 ranges approximately from 30 nm to 200 nm. More specifically, compared with a conventional MOSLSI (Large Scale Integrated Circuit) using an oxide film whose thickness is approximately 500 nm (at least 300 nm) or greater, the LOCOS film of the present embodiment, to be grown to a field region 16, has a ½ or 1/10 thickness, i.e., approximately 30 nm to 200 nm. This thickness in the present embodiment relies on the fact that the portion of the parasitic transistor is removed from the Si film, that is, there will be no parasitic transistor generated in this structure.

This structure allows creation of a thin film device, which can coexist with a non-singlecrystalline Si on the insulating substrate such as a large glass substrate. This structure also achieves great reduction in time for oxidization, besides the oxidization can be carried out not in a wet method but in a dry method at a practically satisfactory level. Particularly, since the stress due to oxidization in the edge of the oxide film is greatly reduced, the characteristics of the transistor become stable. Further, the thin oxide film helps reduction of Bird's Beak, thus providing a minute device area in the transistor with high accuracy.

Further, in the semiconductor substrate 10 according to the present embodiment, as shown in the figure, an ion implantation layer 9 is formed on the singlecrystalline Si wafer 8 with a predetermined depth, inside the active layer 6. This ion implantation layer 9 is formed by implanting either or both of hydrogen ion and inactive element ion such as helium (He) ion, having a predetermined concentration. With this arrangement, as described later, a part of the singlecrystalline Si wafer 8 can be removed through the ion implantation layer 9.

Figure 2:
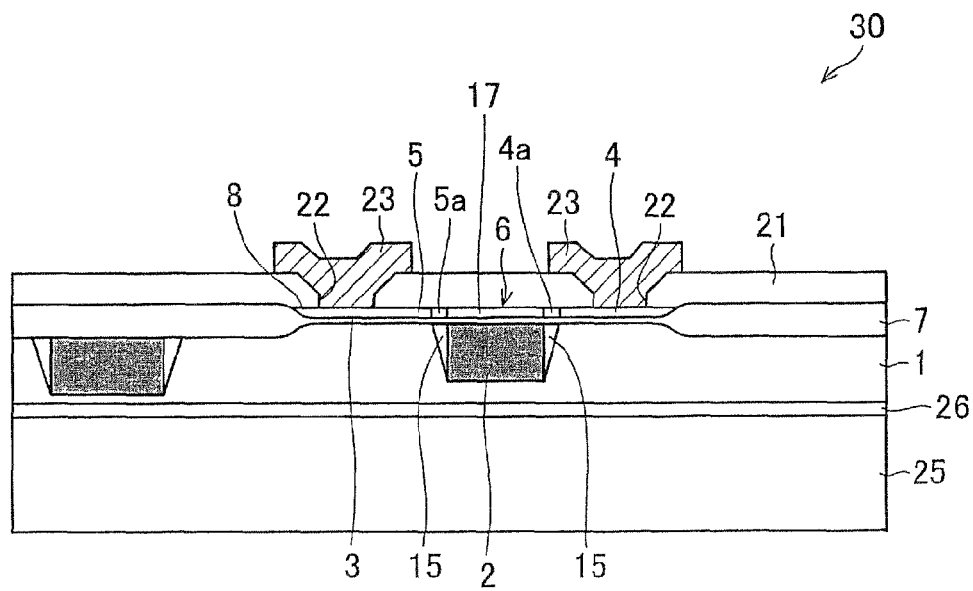
FIG. 2 is a cross-sectional view illustrating a structure of a semiconductor device made of a semiconductor substrate, provided with a metal wiring layer.

Meanwhile, in the present embodiment, the semiconductor substrate 10 may include at least one metal wiring layer, as shown in FIG. 2.

Specifically, this semiconductor substrate 10 includes a gate electrode 2 formed on the planarization insulating film 1; a gate insulating film 3 formed on the gate electrode 2, an active layer 6 not containing a well-structure, formed on the gate insulating film 3; a LOCOS oxide film 7; a protective-insulating-interlayer film 21 formed over the active layer 6 and the LOCOS oxide film 7; and metal wiring layers 23 formed on the surface of the protective-insulating-interlayer film 21. The active layer 6 is made of a singlecrystalline Si having impurity implantation portions of N+ or P+, which are to be the source/drain regions 4/5. These impurity portions are formed in the element-forming-region in which a shallow reverse-conductive impurity is doped. The LOCOS oxide film 7 is formed around the active layer 6. The metal wiring layers 23 are connected to the source and drain regions 4 and 5, respectively, through contact holes 22 which are formed on the protective-insulating-interlayer film 21 to establish conduction.

Further, as shown in FIG. 2, the semiconductor device 30 of the present embodiment is formed by bonding the semiconductor substrate 10 onto an insulating substrate 25. More specifically, as shown in the figure, in the semiconductor device 30, a semiconductor device 10 is formed on the insulating substrate 25 through a silicon dioxide film ($SiO_2$) 26 which is formed by plasma CVD using TEOS (Si $(OC_2H_5)_4$: Tetra Ethyl Ortho Silicate).

Figure 3:
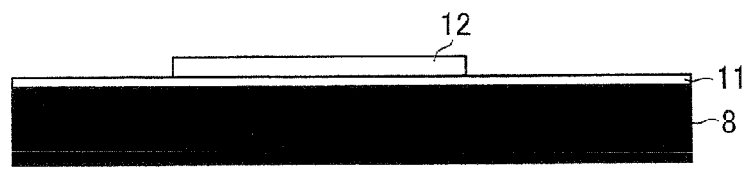
FIG. 3 (a) through 3 (g) are cross-sectional views illustrating manufacturing processes of the foregoing semiconductor substrate and the semiconductor device.
Figure 3:
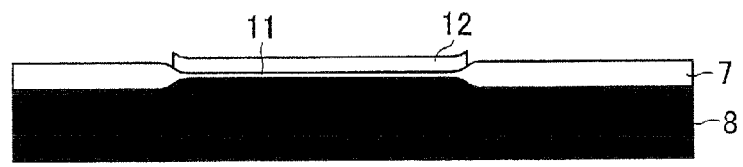
Figure 3:
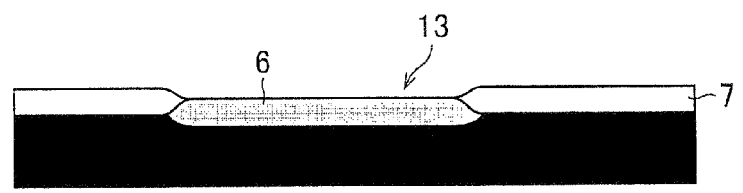
Figure 3:
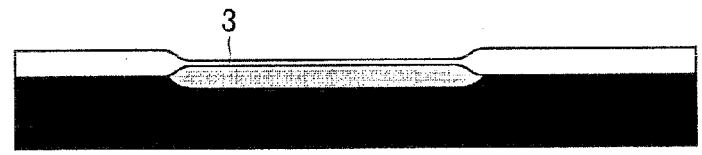
Figure 3:
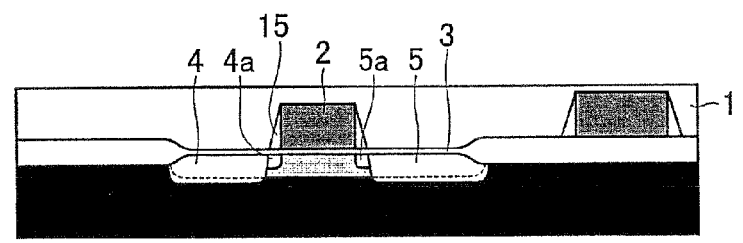
Figure 3:
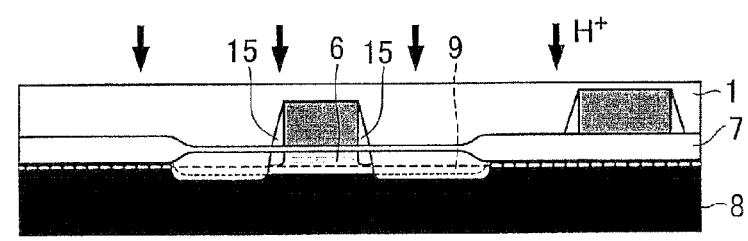
Figure 3:
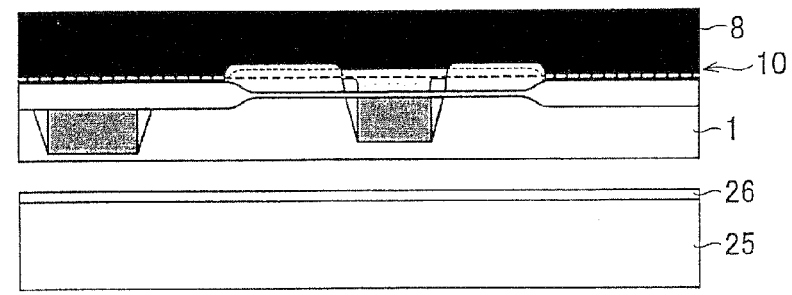
Figure 4:
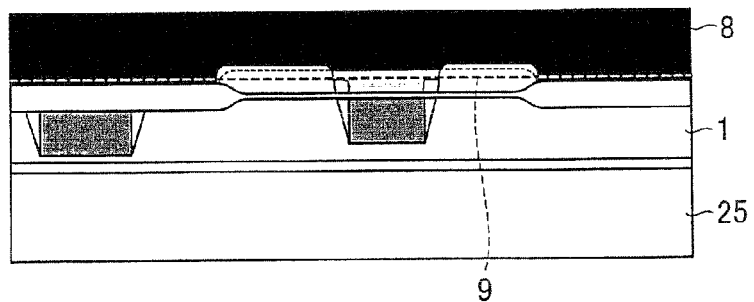
FIGS. 4(a) through 4(e) are cross sectional views illustrating manufacturing processes of the semiconductor device, these processes are performed after the processes of FIG. 3(g).
Figure 4:
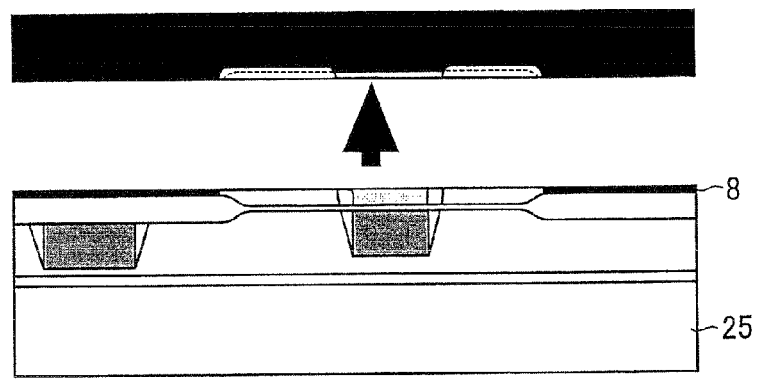
Figure 4:
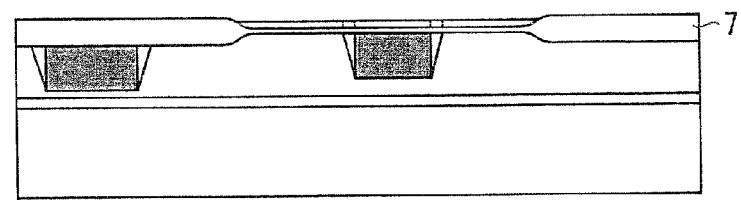
Figure 4:
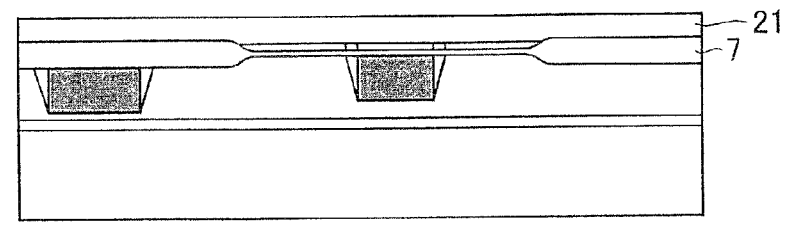
Figure 4:
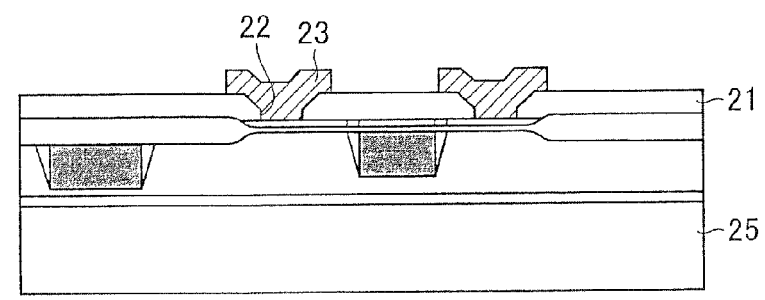
Figure 5:
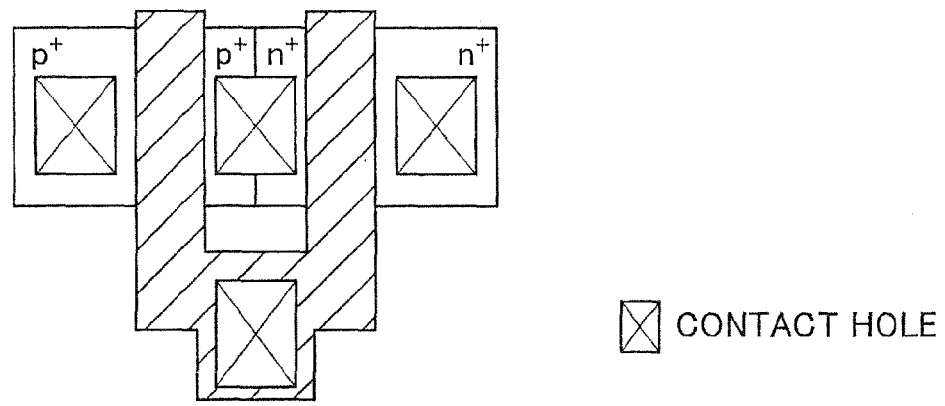
FIG. 5(a) is a plan view showing a size of the semiconductor device after the contact hole is formed.
FIG. 5(b) is a plan view for comparison, showing a size of a conventional semiconductor device after the contact hole is formed.
Figure 5:
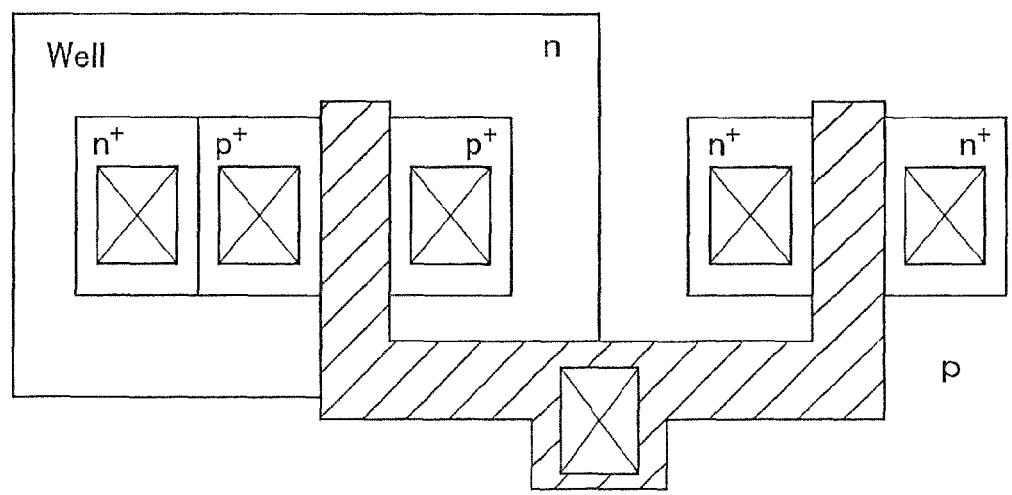

With reference to FIGS. 3(*a*) through 3(*g*), and FIGS. 4(*a*) through 4(*e*), the following explains a fabrication method of the semiconductor substrate 10 and the semiconductor device 30.

First, as shown in FIG. 3(*a*), a singlecrystalline Si wafer 8 made of a singlecrystalline silicon (Si) is prepared, and its surface is subjected to oxidization so as to form a thin silicon dioxide ($SiO_2$) film 11 with a thickness of about 30 nm. Next, a silicon nitride (SiN) film 12 is deposited over the silicon dioxide ($SiO_2$) 11 by plasma CVD (Chemical Vapor deposition), and then, the silicon nitride (SiN) film 12 is removed by etching except for the device area.

Next, as shown in FIG. 3(*b*), by using the silicon nitride (SiN) 12 as a mask, and using an oxide film with a thickness of about 120 nm made of a silicon dioxide ($SiO_2$) as a field oxide film, a LOCOS oxide film 7 is grown by dry oxidization.

Next, as shown in FIG. 3(*c*), the silicon nitride (SiN) film 12 is removed by etching, and boron (B) and phosphorous (P) are implanted in the device area 13 surrounded by the LOCOS oxide film 7, which is a field oxide film, for adjustment of the threshold voltage in the N/P channel regions; and then, the silicon dioxide ($SiO_2$) film 11 is removed. More specifically, in the device area 13, implantation of boron (B) ion creates a P-region, where, as described later, arsenic (As) ion is further implanted to form the source and drain regions 4 and 5 to form a N-type MOS transistor. On the other hand, by implanting phosphorous (As) ion to the device area 13, and further implanting boron difluoride ($BF_2$) ion to form the source and drain regions 4 and 5, a P-type MOS transistor is formed. Further, in the present embodiment, the N-type MOS transistor and the P-type MOS transistor are formed at the same time, to be a CMOS transistor. The region having the channel region (the region beneath the gate electrode 2), the source region 4, and the drain region 5 becomes the active layer 6. Further, an impurity ion is implanted in the channel region beneath the gate electrode 2, so as to adjust the threshold voltage.

Thereafter, as shown in FIG. 3(*d*), a 15 nm thick silicon dioxide ($SiO_2$) is deposited by dry oxidization to form the gate insulating film 3.

Next, as shown in FIG. 3(*e*), a polycrystalline silicon (Si) (Poly-Si, hereinafter) or the like is formed on the gate insulating film 3, with a thickness of about 300 nm, then, phosphorous oxychloride ($POCl_3$: not shown) is deposited thereon, and heated at 850° C. for diffusion. The product is patterned to form the gate electrode 2, and boron (B) or phosphorous (P) is implanted to form the LDD structures 4a and 5a. Further, a silicon dioxide ($SiO_2$) of about 300 nm is deposited thereon, which is then etched back by reaction ion etching (RIE) to form the side walls 15.

Next, arsenic (As) ion or boron fluorine ($BF_2$) ion is implanted to form the source and drain regions, followed by activation annealing at about 900° C., thereby forming the source region 4 and the drain region 5. Next, a silicon dioxide ($SiO_2$) with a thickness of about 100 nm is deposited by APCVD (Atmospheric Pressure CVD), and a silicon dioxide ($SiO_2$) with a thickness of about 400 nm is further deposited by PECVD (Plasma Enhanced CVD) using TEOS, which is then polished by CMP (Chemical Mechanical Polishing) for about 100 nm to flatten the surface, thereby forming a planarization insulating film 1.

Next, as shown in FIG. 3(*f*), hydrogen (H) ion or the like is implanted into the singlecrystalline Si wafer 8 through the planarization insulating film 1. Here, hydrogen (H) ion with a dose of $5.5 \times 10^{16}$ cm$^{-2}$ is implanted in the ion implantation layer 9 at 100 keV. Note that, the hydrogen (H) ion is not limited to this, but may be helium (He) ion or the like. Further, in the present embodiment, the power for implantation is adjusted so that the resulting ion implantation layer 9 formed in the active layer 6 of singlecrystalline Si extends into the Si crystal beneath the LOCOS oxide film 7.

Thereafter, as shown in FIG. 3(*g*), the substrate turned upside down, and is subjected to washing and surface activation together with another insulating substrate 25 on which a silicon dioxide ($SiO_2$) with a thickness of about 100 nm is formed by a plasma CVD using TEOS and oxygen gas. The washing and surface activation is performed by megasonic shower of a mixture liquid (SC1 liquid) of ammonia water, hydrogen peroxide solution and pure water. After cleaning and surface activation, the substrate 10 is bonded to the insulating substrate 25 in accordance with the marker (not shown) on the planarization insulating film 1, as shown in FIG. 4(*a*). Here, the insulating substrate 25 is bonded because of the planarization insulating film 1, Van der Waals force and hydrogen bond. Note that, instead of the SC1 cleaning, the surface may be activated by being exposed in oxygen plasma atmosphere. Further, in FIG. 3(*g*), the insulating substrate 25 has the same size as the semiconductor substrate 10, but it may be a larger glass substrate whose area corresponds to a large number of semiconductor substrates 10. Note that, in the present embodiment, the insulating substrate 25 is made of a glass, for example, "code 1737", a product of Corning (alkali-earth alumino-boro-sillicated glass).

Next, the combined body is subjected to annealing at about 250° C. for two hours to ensure the bonding. Thereafter, through heat treatment at about 600° C. for three minutes, the body is cleaved at the ion implantation layer (projection range of ion implantation) 9 so as to separate the singlecrystalline Si wafer 8, as shown in FIG. 4(*b*).

Next, as shown in FIG. 4(*c*), a silicon dioxide ($SiO_2$) with a thickness of about 100 nm is deposited on the divided surface by plasma CVD, and is etched back by reaction ion etching (RIE). At this stage, first, mixture gas of carbonfluoride ($CF_4$) and hydrogen is used. After etching is done for about 100 nm, the mixture gas is replaced with another mixture gas of carbon-fluorine ($CF_4$) and oxygen, and the reaction ion etching is continued. The etching is stopped when the singlecrystalline Si film is all removed from the LOCOS oxide film 7 as the filed oxide film. Here, as it is difficult to monitor the termination of etching, the etching is stopped after a certain time elapsed, which time was decided in advance based on the etching rate.

Thereafter, as shown in FIG. 4(d), the surface is lightly etched with buffered hydrogen fluoride (HF), and the substrate is heated to 380° C. Then a silicon dioxide (SiO2) of about 400 nm is deposited by PECVD using TEOS to form a protective-insulating-interlayer film 21.

Next, as shown in FIG. 4(e), the contact holes 22 are created on the protective-insulating-interlayer film 21, and a material for metal wiring is deposited therein to form the metal wiring layers 23. This embodiment uses Ti/TiN/Al—Si/TiN/Ti, whose total thickness is about 400 nm. Then, the material is patterned into a predetermined shape. Consequently, as shown in FIG. 2, a semiconductor device 30 including many singlecrystalline Si TFTs is formed on the insulating substrate 25.

The CMOS inverter, as the basic circuit element of the semiconductor device thus fabricated is shown in FIG. 5(a). As can be seen in the figure, this CMOS inverter has a lot smaller area than the conventional CMOS inverter shown in FIG. 5(b).

As explained, the semiconductor substrate 10 of the present embodiment is a singlecrystalline Si MOS transistor formed on a device area surrounded by a thin field oxide film. Because of the omission of well structure, the configuration becomes simple, thereby achieving an increase in yield and a decrease in cost. Though this semiconductor substrate does not operate alone, it ensures high performance when transferred onto the insulating substrate 25, which is made of a different glass substrate or the like. Further, the semiconductor device 30 includes a $SiO_2$ film, a MOS non-singlecrystalline Si thin film transistor including a non-singlecrystalline Si thin film made of a polycrystalline Si, a MOS singlecrystalline Si thin film transistor including a singlecrystalline Si thin film, and metal wiring.

Further, in the present embodiment, a thin film device, which can coexist with a non-singlecrystalline Si, is transferred onto, for example, a large glass substrate in the following manner. First, boron ion or phosphorous ion with a predetermined concentration is implanted in an area, which is surrounded by the field oxide film and becomes either a n-channel area or a p-channel area, so as to adjust the threshold voltage. Then, the gate insulating film 3, and the gate electrode 2 are formed, and if necessary, LDD, HALO or Pocket implantation is carried out. Further, N+ or P+ is implanted to form the source/drain regions 4/5, and a planarization film is formed. Hydrogen ion or He ion with a predetermined concentration is implanted alone or together with He, Ne or the like to a predetermined depth. The substrate is then cut into a predetermined shape, and the surface is activated by oxygen plasma, hydrogen peroxide solution, or RCA1 cleaning solution (SC1). The substrate is then closely brought into contact with an insulating substrate 25 on which a part or the whole non-singlecrystalline Si TFT is formed, followed by bonding and heat treatment. As a result, the bulk singlecrystalline Si portion is cleaved at the ion implantation layer 9 to become a thin film.

Next, the surface of the singlecrystalline Si is etched back by RIE (reactive ion etching) to shape the substrate into a thin film, and the etching is continued until the Si film is all removed from the LOCOS oxide film 7. In this manner, it is possible to create the minute transistor region without accurate positioning, thereby ensuring device isolation.

Note that, by forming a silicon dioxide ($SiO_2$) film on the thin film of the singlecrystalline Si, thus created through the cleavage, through PECVD using TEOS or the like, and etching back the film by etchant gas, which has a composition (e.g., $CF_4$ and hydrogen) allowing to the whole film, including the deposited oxide film and the singlecrystalline Si film, to have a predetermined thickness, the surface of the film is flattened and the leak current is reduced in the resulting device.

This process allows omission of well-structure, ion implantation for channel stop or the like, well contact region etc., which are required in a common MOSLSI, thus allowing great simplification in space and process.

Consequently, the thickness of the singlecrystalline Si thin film becomes substantially ½ of the whole thickness of the Si oxide film (LOLOS oxide film 7) formed around the active layer 6, so that the pattern edge of the singlecrystalline Si thin film almost matches with the inclination of the pattern edge of the Si oxide film around the active layer 6. With this configuration, device isolation is ensured, thereby reducing leak current due to defective edge of Si island and stress in the conventional island etching.

Further, the protective-insulating-interlayer film 21 is deposited thereon, the contact holes 22 are further formed therein, and the metal wiring layer 23 is formed. The device is here completed.

Here, the protective-insulating-interlayer film 21 is made of a protection insulating film and an interlayer insulating film, which may be formed of the same material as long as their function and characteristics are ensured.

Further, after implantation of hydrogen ion etc., conduction with source and drain is established by metal wiring, which is formed of a metal with a high melting point, and is not easily oxidized; then, a planarization film is deposited thereon, whose surface is flattened by CMP or the like to make an appropriate condition for combining with the insulating substrate 25, before bonded to the insulating substrate 25, and the bulk Si is cleaved through heat treatment. In this manner, it is possible to realize both miniaturization and higher integration density.

As described, in the semiconductor substrate 10 and the semiconductor device 30 and the fabrication methods of those according to the present embodiment, there is provided an active layer 6 having a channel region 17, a source region 4, and a drain region 5; and a singlecrystalline Si wafer 8 including at least a part of a device structure not containing a well-structure or a channel stop region is used.

With this arrangement using a singlecrystalline Si, the resulting semiconductor device is superior in performance and less varied in characteristic.

Further, in the present embodiment not providing a conventional well, a channel stop, or a well-contact, the area of the device area 13 is reduced, allowing more dense integration, thereby realizing a highly-dense semiconductor substrate 10. Further, since the conventional well is omitted, the transistor may be made thinner than the conventional structure using a well. Thus, the semiconductor element can be made as a thin film which can coexist with the TFTs formed from other polycrystalline Si upon formation of the semiconductor device 30, allowing conduction between the semiconductor element and TFTs through common thin film wiring.

Further, since the element is made as a thin film, it is possible to ensure the device isolation of the minute singlecrystalline Si device even on the insulating substrate 25, such as a large glass substrate, without highly-accurate photolithography. Further, since the well is omitted, the fabrication process is simplified.

Further, in the present embodiment, the LOCOS oxide film 7, thicker than the gate insulating film 3, is formed by surrounding the active layer 6. This LOCOS oxide film 7 securely ensures the device isolation.

On this account, on fabricating the semiconductor device 30 having a high-performance integration system by forming the non-singlecrystalline Si semiconductor element and the singlecrystalline Si semiconductor element on the large insulating substrate 25, the process for making the singlecrystalline Si is simplified. Further, the foregoing arrangement provides a semiconductor substrate and a fabrication method thereof, which ensures device isolation of the minute singlecrystalline Si semiconductor element without highly-accurate photolithography, when the singlecrystalline Si semiconductor element is transferred onto the large insulating substrate 25. Note that, though the present embodiment uses a large insulating substrate 25, the present invention may use a smaller insulating substrate.

Further, in the semiconductor substrate 10 and the semiconductor device 30 and the fabrication methods of those according to the present embodiment, the source region and the drain region of the active layer at least have a LDD structure. Therefore, the change in density distribution of impurities in the vicinity of the drain becomes less rapid, and the electric field strength in the vicinity of the drain region 5 is reduced, thereby improving reliability.

Further, in the semiconductor substrate 10 and the semiconductor device 30 and the fabrication methods of those according to the present embodiment, the planarization insulating film 1 has a flat upper surface. On this account, the insulating substrate 25, which is realized by a flat glass substrate or the like, may be bonded to the planarization insulating film 1.

In the semiconductor substrate 10 and the semiconductor device 30 and the fabrication methods of those according to the present embodiment, in contrast to a conventional MOSLSI (Large Scale Integrated Circuit) using an oxide film whose thickness is approximately 500 nm (at least 300 nm) or greater, the LOCOS film, which is to be grown to a field region 16, has a ½ or 1/10 thickness, i.e., approximately 30 nm to 200 nm.

This structure achieves great reduction in time for oxidization, besides the oxidization can be carried out not in a wet method but in a dry method at a practically satisfactory level. Particularly, since the stress due to oxidization in the edge of the oxide film is greatly reduced, the characteristics of the transistor become stable. Further, the thin oxide film helps reduction of Bird's Beak, thus providing a minute device area in the transistor with high accuracy.

Further, in the semiconductor substrate 10 and the semiconductor device 30 and the fabrication methods of those according to the present embodiment, an ion implantation layer is formed in the singlecrystalline Si substrate with a predetermined depth through implantation of one or plural kinds of ion selected from a hydrogen ion group or an inactive element ion group. With this arrangement, the wafer is cleaved at the ion implantation layer 9 by heat treatment. This structure allows creation of a thin film device, which can coexist with a non-singlecrystalline Si on a large insulating substrate or the like.

Further, in the semiconductor substrate 10 and the semiconductor device 30 and the fabrication methods of those according to the present embodiment, the ion implantation layer 9 formed in the singlecrystalline Si wafer 8 with a predetermined depth is formed in a portion lower than the LOCOS oxide film 7. On this account, by etching back the surface of the singlecrystalline Si thin film, which became a thin film by cleavage, to the implantation surface of the LOCOS oxide film, the surface is flattened. With this arrangement, the leak current is reduced in the resulting device.

Further, in the semiconductor substrate 10 and the semiconductor device 30 and the fabrication methods of those according to the present embodiment, the LOCOS oxide film 7 is a thin film, which can be formed by dry oxidation. Therefore, it is possible to greatly reduce the stress upon oxidization of ends of the oxide film, thereby obtaining a transistor with stable characteristics.

Further, semiconductor device 30 of the present embodiment includes the insulating substrate 25, and a singlecrystalline Si semiconductor element formed on the insulating substrate 25. The semiconductor device 30 is realized by, for example, a glass insulating substrate 25 and a singlecrystalline Si semiconductor element combined together.

Further, the singlecrystalline Si semiconductor element comprising a gate electrode 2 formed above the insulating substrate 25; a gate insulating film 3 formed on the gate electrode 2; an active layer 6, which is formed on the gate insulating film 3 and is made of a singlecrystalline Si layer having a channel region 17, a source region 4, and a drain region 5; a LOCOS oxide film 7 formed around the active layer 16; and an interlayer insulating film 21 formed over the active layer 6 and the LOCOS oxide film 7.

On this account, on fabricating the semiconductor device 30 having a high-performance integration system by forming the non-singlecrystalline Si semiconductor element and the singlecrystalline Si semiconductor element on the large insulating substrate 25, the process for making the singlecrystalline Si is simplified. Further, the foregoing arrangement provides a semiconductor substrate and a fabrication method thereof, which ensures device isolation of the minute singlecrystalline Si semiconductor element without highly-accurate photolithography, when the singlecrystalline Si semiconductor element is transferred onto the large insulating substrate 25.

Further, the semiconductor device 30 according to the present embodiment includes a metal wiring layer 23, which is formed on the protective-insulating-interlayer film 21 and is connected to the source and drain regions 4 and 5 via contact holes 22 formed in the protective-insulating-interlayer film 21.

Further, a fabrication method of a semiconductor device 30 according to the present embodiment comprises the steps of: (a) bonding the semiconductor substrate 10, formed by the foregoing fabrication method of the semiconductor substrate 10, onto the insulating substrate 25, (b) dividing the singlecrystalline Si substrate at the ion implantation layer 9 by heat treatment so as to detach a part of the singlecrystalline Si wafer 8; (c) etching a part of the singlecrystalline Si on the insulating substrate 25 so as to expose a surface of the LOCOS oxide film 7; (d) forming an the protective-insulating-interlayer film 21 over the active layer 6 and the LOCOS oxide film 7; and (e) forming a metal wiring layer 23 on the protective-insulating-interlayer film 21, and connecting the metal wiring layer 23 to the source and drain regions 4 and 5 via contact holes 22, which is formed in the protective-insulating-interlayer film 21.

The foregoing arrangement includes a metal wiring layer 23, which is formed on the protective-insulating-interlayer film 21 and is connected to the source and drain regions 4 and 5 via contact holes 22 formed in the protective-insulating-interlayer film 21. With this arrangement, the semiconductor device 30 is conducted to other circuits, power supply etc. through this metal wiring layer 23. Further, the metal wiring layer 23 can be formed after the semiconductor substrate 10 having the singlecrystalline Si semiconductor element is bonded to the insulating substrate 25.

On this account, on fabricating the semiconductor device 30 having a high-performance integration system by forming the non-singlecrystalline Si semiconductor element and the singlecrystalline Si semiconductor element on the large insulating substrate 25, the process for making the singlecrystalline Si is simplified. Further, the foregoing arrangement provides a semiconductor substrate and a fabrication method thereof, which ensures device isolation of the minute singlecrystalline Si semiconductor element without highly-accurate photolithography, when the singlecrystalline Si semiconductor element is transferred onto the large insulating substrate 25.

Further, in the semiconductor substrate 10 and the semiconductor device 30 and the fabrication methods of those according to the present embodiment, the upper surface of the active layer 6 exists lower than the upper surface of the LOCOS oxide film 7, because the surface of the singlecrystalline Si thin film, which became a thin film by cleavage, is etched back to be lower than the surface of the LOCOS oxide film 7 to be a flat plane. With this arrangement, the leak current is reduced in the resulting device.

Further, in the semiconductor substrate 10 and the semiconductor device 30 and the fabrication methods of those according to the present embodiment, both edges of the active layer lie along inclinations of edges of the LOCOS oxide film. With this configuration, device isolation is ensured, thereby reducing leak current due to defective edge of Si island and stress in the conventional island etching.

Figure 6:
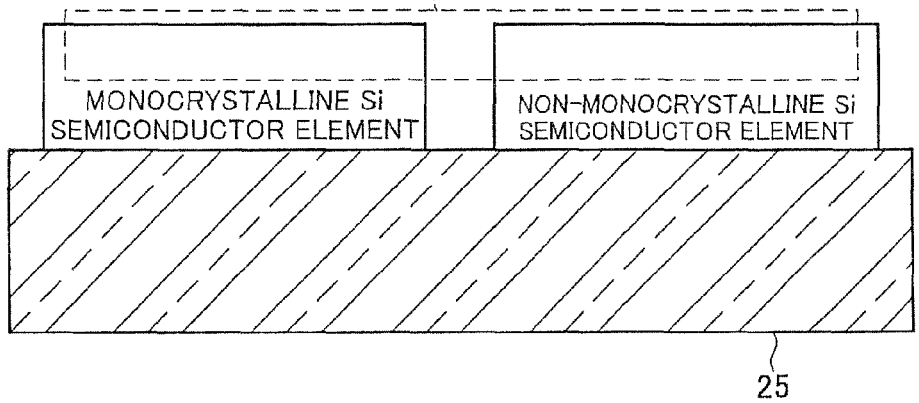
FIG. 6 is a cross sectional view illustrating a semiconductor device in which a singlecrystalline Si semiconductor element and a non-singlecrystalline Si semiconductor element coexist on the insulating substrate.

Further, as shown in FIG. 6, in the semiconductor device 30 and the fabrication method thereof according to the present embodiment, the singlecrystalline Si semiconductor element is formed in one portion of the insulating substrate, and a non-singlecrystalline Si semiconductor element is formed on another portion of the insulating substrate.

This arrangement allows coexistence of a singlecrystalline Si semiconductor element and a non-singlecrystalline Si semiconductor element on the insulating substrate 25.

In the conventional liquid crystal display device or the other conventional displays, switching transistors for the pixels are formed of non-singlecrystalline Si semiconductor elements on the insulating substrate 25 of glass or the like. Then, after the wiring pattern for the transistors are formed, the display drive circuit for driving the display section and/or the processing circuit for outputting predetermined signals to the display drive circuit is provided in the from of COG or COF realized by the singlecrystalline Si semiconductor element, and the circuit is then connected to the wiring pattern.

Figure 7:
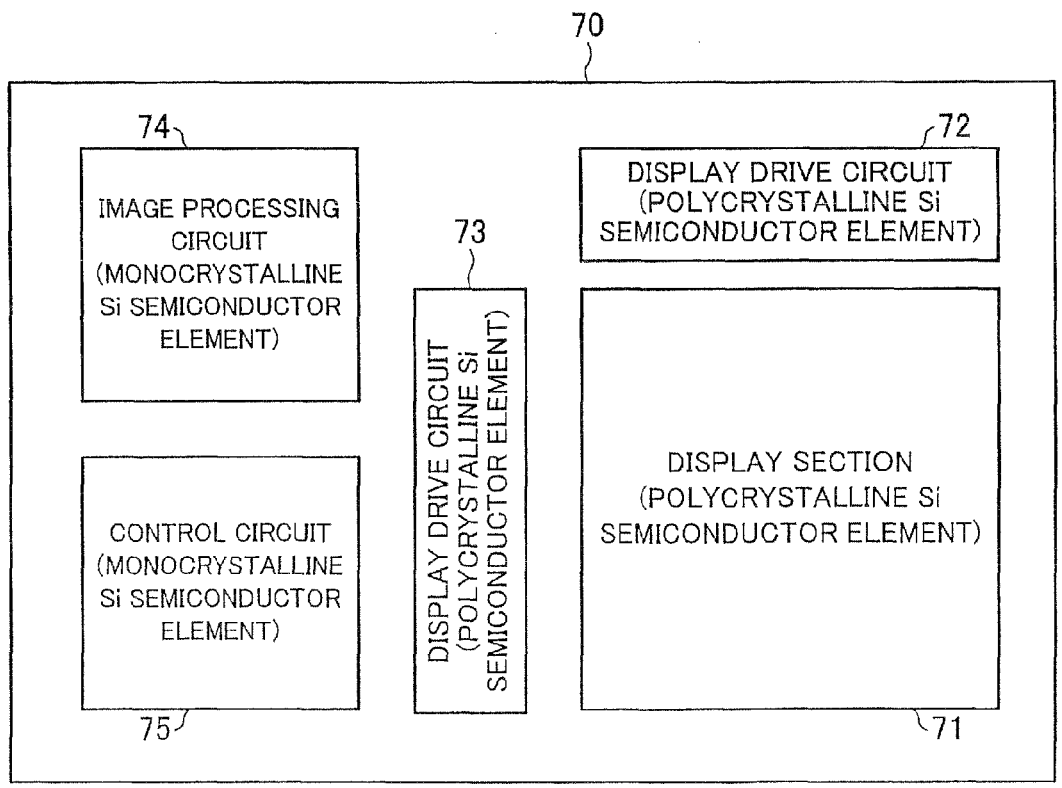
FIG. 7 is a plan view illustrating a display section with the pixels having switching transistors formed from a non-crystalline Si semiconductor element, and a display device including a processing circuit including a transistor formed from a singlecrystalline Si semiconductor device.

However, in the present embodiment, as shown in FIG. 7, at least a part of the singlecrystalline Si semiconductor element constitutes the switching transistor which controls display of each pixel constituting a display section 71, and the transistor constituted of the singlecrystalline Si semiconductor element constitutes either a display drive circuit 72/73 for driving the display section, or a processing circuit 74/75 for outputting a predetermined signal to the display drive circuit 72/73; further, the transistor is also used as a substrate for constituting the display device 70.

On this account, after the part or the whole of the non-singlecrystalline Si semiconductor element and the part of the singlecrystalline Si semiconductor element are formed on the insulating substrate 25, their conduction is made by a common wiring layer. On this account, it is possible to provide a semiconductor device 30 which realizes a high-quality display device with high productivity.

Further, in the fabrication methods of the semiconductor device 30 according to the present embodiment, before they are bonded, surfaces of the semiconductor substrate 10 and the insulating substrate 25 are activated through either washing by cleaning water containing a hydrogen peroxide solution, or by exposure under oxygen-plasma atmosphere.

As a result, the semiconductor substrate 10 and the insulating substrate 25 are bonded by Van der Waals or hydrogen bond, without an adhesive. Note that, this bonding becomes a firm Si—O coupling through the heat treatment performed thereafter.

Further, in the fabrication method of the semiconductor device 30 according to the present embodiment, the heat treatment in the singlecrystalline Si substrate removal process is carried out at a temperature ranging approximately from 250° C. to 600° C.

In this method, the singlecrystalline Si semiconductor element is heated to, for example, a temperature at which the hydrogen ion is separated from the Si, thus securing the bonding strength between the semiconductor substrate and the insulating substrate 25; further, the heat causes the wafer body to be cleaved at the ion implantation layer 9, detaching a part of the singlecrystalline Si wafer 8.

[Second Embodiment]

Another embodiment of the present invention is explained below with reference to FIGS. 8 through 11. Note that, the following embodiment is identical to First Embodiment except for the arrangements explained below. For ease of explanation, materials having the equivalent functions as those shown in the drawings pertaining to the foregoing First Embodiment will be given the same reference symbols, and explanation thereof will be omitted here.

In the semiconductor substrate 10 and the semiconductor device 30 according to First Embodiment, as shown in FIG. 2, the metal wiring layers 23 as external electrodes are connected directly to the source and drain regions 4 and 5 through contact holes 22 of the protective-insulating-interlayer film 21.

Figure 8:
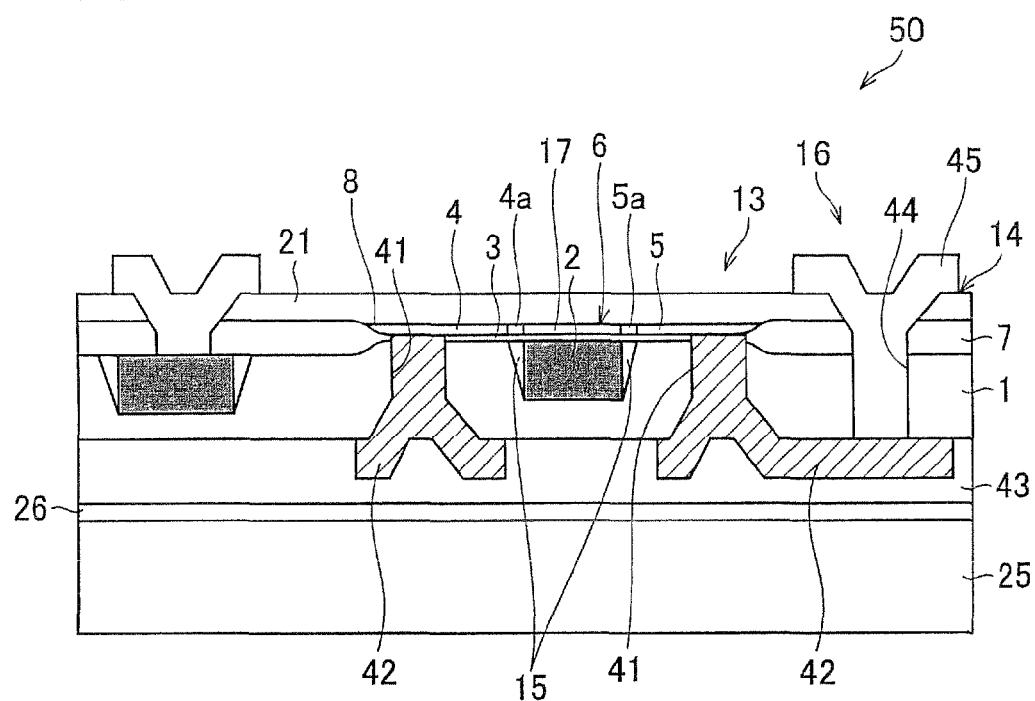
FIG. 8 is a cross-sectional view illustrating a structure of a semiconductor device, according to another embodiment of the present invention.
Figure 9:
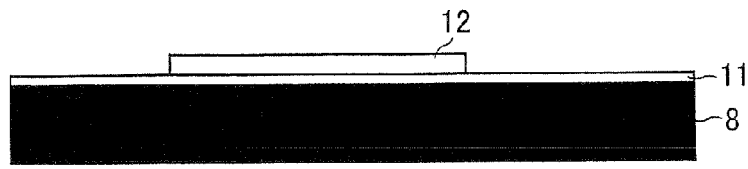
FIGS. 9(a) through 9(g) are cross-sectional views illustrating manufacturing processes of the foregoing semiconductor substrate and the semiconductor device.
Figure 9:
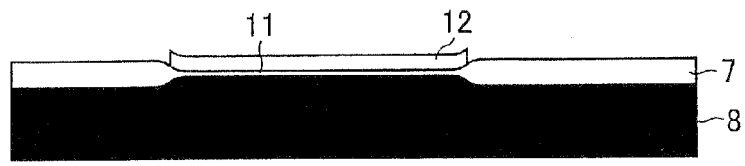
Figure 9:
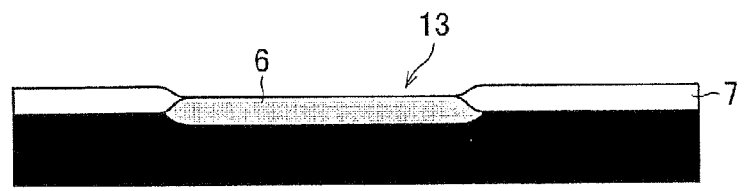
Figure 9:
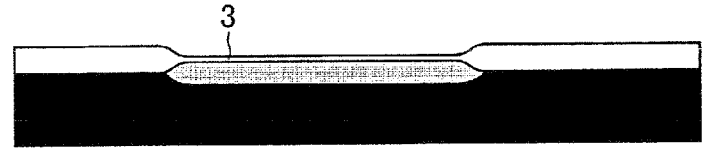
Figure 9:
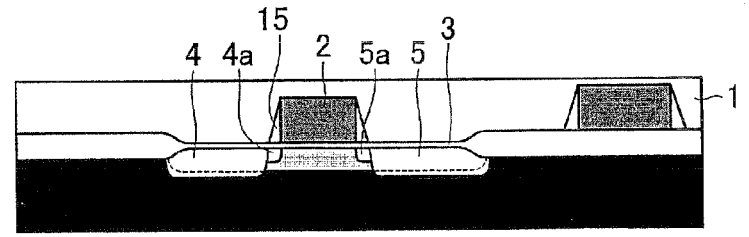
Figure 9:
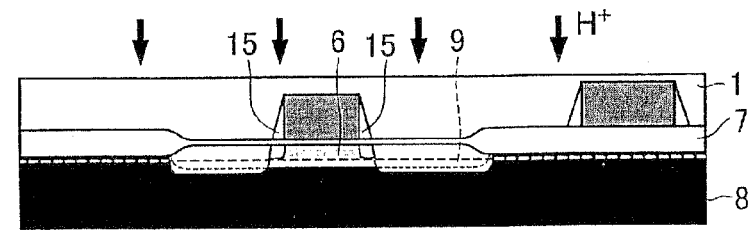
Figure 9:
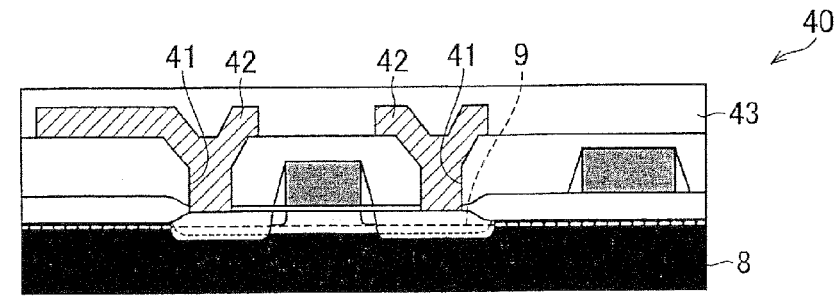

On the other hand, as shown in FIG. 8, in the semiconductor device 50 according to the present embodiment, the first metal wiring 42, which is the first wiring layer for making conduction with the source/drain region 4/5, is first lead to the rear surface of the semiconductor substrate 40 and the semiconductor device 50 (both described later), and then is drawn back onto the surface of the semiconductor substrate 40 and the semiconductor device 50 in the field region 16 formed around the device area 13, as second metal wiring 45, which is a second wiring layer.

Specifically, as shown in the figure, the semiconductor substrate 40 according to the present embodiment includes an insulating substrate 25 and a singlecrystalline Si semiconductor element formed on the insulating substrate 25.

The singlecrystalline Si semiconductor element includes; a gate electrode 2 formed above the insulating substrate 25; a gate insulating film 3 formed on the gate electrode 2; an active layer 6 formed of a singlecrystalline Si layer, having a channel region 17 and source/drain regions 4 and 5, formed on the gate insulating film 3; and a LOCOS oxide film 7 formed around the active layer 6; and a protective-insulating-interlayer film 21 formed over the active layer 6 and the LOCOS oxide film 7. The singlecrystalline Si semiconductor element further includes; an interlayer insulating film 43; at least one first metal wiring 42 formed on the upper surface of the interlayer insulating film 43; and a second metal wiring 45, formed on the protective-insulating-interlayer film 21, being connected to the first metal wiring 42.

The active layer 6 is made of a singlecrystalline Si. For threshold control, the active layer 6 does not include a well structure, and is provided with N+ or P+ impurity implantation portion, where the source region 4 and the drain region 5 are formed. These impurity portions are formed in a device area in which a shallow reverse-conductive impurity is doped.

The first metal wirings 42 are connected to the source and drain regions 4 and 5, respectively, through contact holes 41 which are formed on the insulating film 1 and the gate insulating film 3 to establish conduction. The other end of each first metal wiring 42 is exposed to the rear surface of the insulating film 1. Further, the second metal wiring 45, being formed on the surface of the protective-insulating-interlayer film 21 through contact holes 44 which is formed on the insulating film 1, the gate insulating film 3, and the protective-insulating-interlayer film 21 to establish conduction, is connected to the first metal wiring 42.

Further, as shown in the figure, the semiconductor device 50 is formed by mounting the foregoing semiconductor substrate 40 onto the insulating substrate 25, such as a glass substrate. More specifically, the semiconductor device 50 is mounted on the insulating substrate 25 through a silicon dioxide film ($SiO_2$) 26 which is formed by plasma CVD using TEOS.

With reference to FIGS. 9(a) through 9(g), and FIGS. 10(a) through 10(e), the following explains a fabrication method of the semiconductor substrate 40 and the semiconductor device 50. The processes shown in FIGS. 9(a) through 9(f) are the same as those of FIG. 3(a) through 3(f).

First, as shown in FIG. 9(a), a singlecrystalline Si wafer 8 made of a singlecrystalline silicon (Si) is prepared, and its surface is subjected to oxidization so as to form a thin silicon dioxide ($SiO_2$) film 11 with a thickness of about 30 nm. Next, a silicon nitride (SiN) film 12 is deposited over the silicon dioxide ($SiO_2$) 11 by plasma CVD (Chemical Vapor deposition), and then, the silicon nitride (SiN) film 12 is removed by etching except for the device area.

Next, as shown in FIG. 9(b), by using the silicon nitride (SiN) 12 as a mask, and using an oxide film with a thickness of about 120 nm made of a silicon dioxide ($SiO_2$) as a field oxide film, a LOCOS oxide film 7 is grown by dry oxidization.

Next, as shown in FIG. 9(c), the silicon nitride (SiN) film 12 is removed by etching, and boron (B) and phosphorous (P) are implanted in the device area 13 surrounded by the LOCOS oxide film 7, which is a field oxide film, for adjustment of the threshold voltage in the N/P channel regions; and then, the silicon dioxide ($SiO_2$) film 11 is removed. The region having the channel region (the region beneath the gate electrode 2), the source region 4, and the drain region 5 becomes the active layer 6. Further, an impurity ion is implanted in the channel region beneath the gate electrode 2, so as to adjust the threshold voltage.

Thereafter, as shown in FIG. 3(d), a 15 nm thick silicon dioxide ($SiO_2$) is deposited by dry oxidization to form the gate insulating film 3.

Next, as shown in FIG. 9(e), a polycrystalline silicon (Si) (Poly-Si, hereinafter) or the like is formed on the gate insulating film 3, with a thickness of about 300 nm, then, phosphorous oxychloride ($POCl_3$: not shown) is deposited thereon, and heated at 800° C. for diffusion. The product is patterned to form the gate electrode 2, and boron (B) or phosphorous (P) is implanted to form the LDD structures 4a and 5a. Further, a silicon dioxide ($SiO_2$) of about 300 nm is deposited thereon, which is then etched back by reaction ion etching (RIE) to form the side walls 15.

Next, arsenic (As) ion or boron fluorine ($BF_2$) ion is implanted to form the source and drain regions, followed by activation annealing at about 900° C., thereby forming the source region 4 and the drain region 5. Next, a silicon dioxide ($SiO_2$) with a thickness of about 100 nm is deposited by APCVD (Atmospheric Pressure CVD), and a silicon dioxide ($SiO_2$) with a thickness of about 400 nm is further deposited by PECVD (Plasma Enhanced CVD) using TEOS, which is then polished by CMP (Chemical Mechanical Polishing) for about 100 nm to flatten the surface, thereby forming a planarization insulating film 1.

Next, as shown in FIG. 3(f), hydrogen (H) ion is implanted into the singlecrystalline Si wafer 8 through the insulating film 1. Here, hydrogen (H) ion with a dose of $5.5 \times 10^{16}$ cm$^{-2}$ is implanted in the ion implantation layer 9 at 100 keV. Note that, the hydrogen (H) ion is not limited to this, but may be helium (He) ion or the like. Further, in the present embodiment, the power for implantation is adjusted so that the resulting ion implantation layer 9 formed in the active layer 6 of singlecrystalline Si extends into the Si crystal beneath the LOCOS oxide film 7.

The processes hereinafter differ from those of First Embodiment.

In the present embodiment, as shown in FIG. 9(e), a 200 nm thick silicon dioxide ($SiO_2$) is further formed thereon, the contact holes 41 are made, and a material for metal wiring is deposited therein to form the first metal wirings 42. In consideration of heat-resistant temperature, the first metal wirings 42 is made as a layer of Ti/TiN/Ti, with s total thickness of about 400 nm. Then, the material is patterned into a predetermined shape.

Next, a silicon dioxide ($SiO_2$) with a thickness of about 400 nm is deposited thereon by PECVD using TEOS, and then the layer is etched back by reaction ion etching (RIE), except for the first metal wirings 42. Further, 500 nm thick silicon oxide ($SiO_2$) is deposited thereon, which is then flattened by CMP to become the interlayer insulating film 43.

Thereafter, as shown in FIG. 10(a), the wafer is cut into a predetermined shape, and is subjected to washing and surface activation together with another insulating substrate 25 on which a silicon dioxide ($SiO_2$) with a thickness of about 100 nm is formed by a plasma CVD using TEOS and oxygen gas. The washing and surface activation is performed by megasonic shower of a mixture liquid (SC1 liquid). After cleaning and surface activation, the wafer is closely brought into contact with the insulating substrate 25 to be bonded thereto in accordance with the marker (not shown) on the interlayer insulating film 43, as shown in FIG. 10(b). Here, the insulating substrate 25 is bonded because of the insulating film 1, Van der Waals force or hydrogen bond. Note that, in FIG. 10(b), the insulating substrate 25 has the same size as the semiconductor substrate 40, but it is actually a large glass substrate whose area is larger than the total area of the large number of semiconductor substrates 10. Note that, in the present embodiment, the insulating substrate 25 is made of a glass, for example, "code 1737", a product of Corning (alkali-earth alumino-boro-sillicated glass).

Next, the combined body is subjected to annealing at about 250° C. for two hours to ensure the bonding. Thereafter, through heat treatment at about 600° C. for three minutes, the body is cleaved at the ion implantation layer (peak position of ion implantation) 9 so as to separate the singlecrystalline Si wafer 8, as shown in FIG. 10(*c*).

Figure 10:
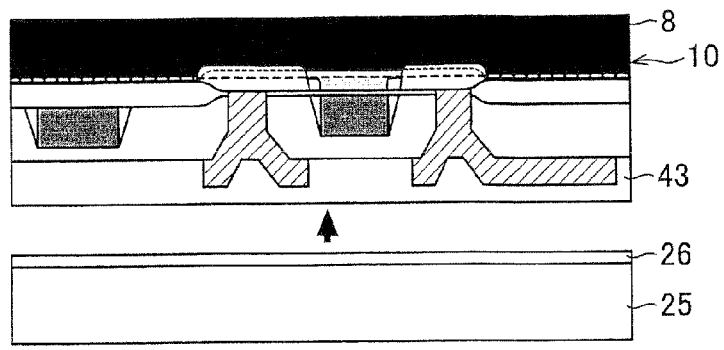
FIGS. 10(a) through 10(e) are cross sectional views illustrating manufacturing processes of the semiconductor device, these processes are performed after the processes of FIG. 9(g).
Figure 10:
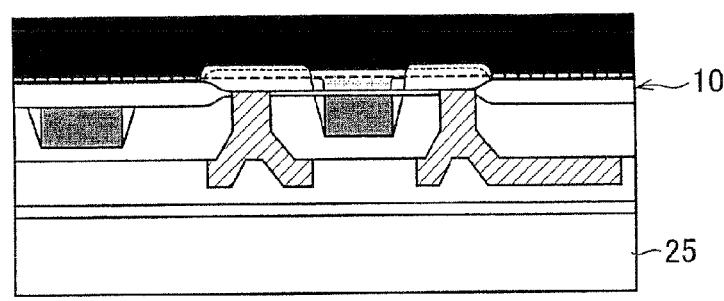
Figure 10:
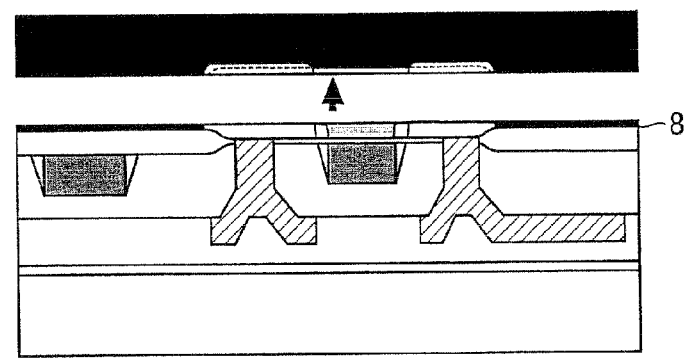
Figure 10:
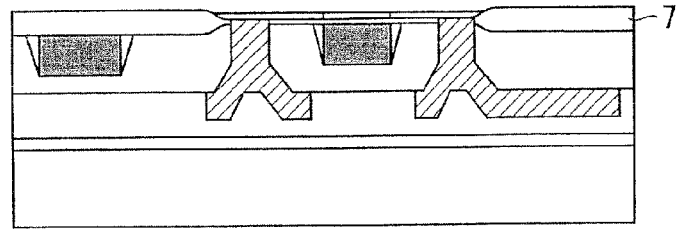
Figure 10:
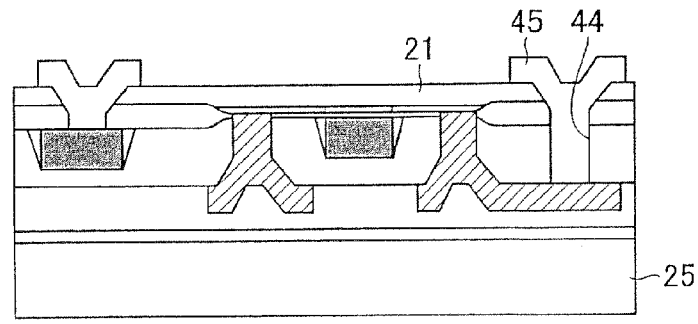
Figure 11:
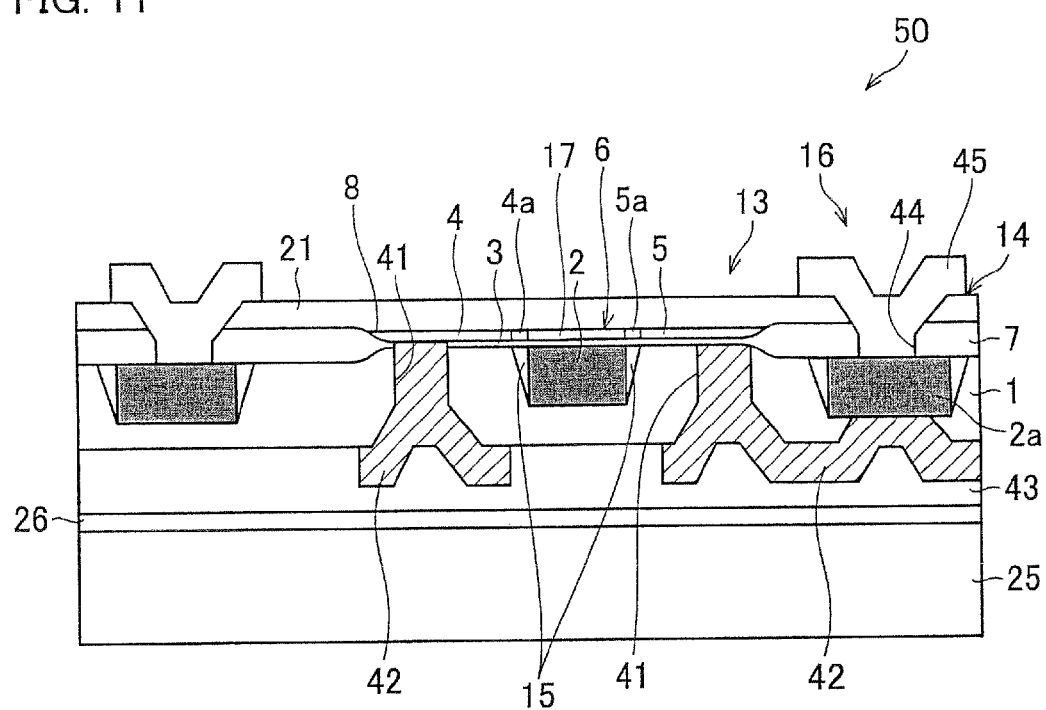
FIG. 11 is a cross-sectional view illustrating a semiconductor device, which is a modification of the semiconductor device of FIG. 8.

Next, as shown in FIG. 10(*d*), a silicon dioxide ($SiO_2$) with a thickness of about 100 nm is deposited on the divided surface by plasma CVD, and is etched back by reaction ion etching (RIE). At this stage, first, mixture gas of carbon-fluorine ($CF_4$) and hydrogen is used. After etching is done for about 100 nm, the mixture gas is replaced with another mixture gas of carbon-fluorine ($CF_4$) and oxygen, and the reaction ion etching is continued. The etching is stopped when the singlecrystalline Si wafer 8 is all removed from the LOCOS oxide film 7 as the filed oxide film. Here, as it is difficult to monitor the termination of etching, the etching is stopped after a certain time elapsed, which time was decided in advance based on the etching rate.

Thereafter, as shown in FIG. 10(*e*), the surface is lightly etched with buffer hydrogen fluoride (HF), and the substrate is heated to 380° C. Then a silicon dioxide (SiO2) of about 400 nm is deposited by PECVD using TEOS to form a protective-insulating-interlayer film 21.

Next, the contact holes 41 are created on the protective-insulating-interlayer film 21, and a material for metal wiring is deposited therein to form the second metal wiring 45. This embodiment uses Ti/TiN/Al—Si/TiN/Ti, whose total thickness is about 400 nm. Then, the material is patterned into a predetermined shape. Consequently, as shown in FIG. 8, a semiconductor device 50 including a singlecrystalline Si semiconductor device is formed on the insulating substrate 25.

Note that, in the semiconductor device 50, the first metal wiring 42 is directly connected to the second metal wiring 45; however, the metal wiring 45 may be arranged differently, for example, it may be connected to the metal wiring layer 42 via a relay electrode made of a gate layer 2*a*. In this case, the contact hole for connecting the second metal wiring 45 to the relay electrode of gate 2*a* can be made shallow, and the yield is increased. More specifically, the first metal wiring 42 is connected to the relay electrode made of a gate 2*a*, while its rear surface is connected to the second wiring 45.

Specifically, as shown in the figure, the semiconductor substrate 40 according to the present embodiment includes an insulating substrate 25 and a singlecrystalline Si semiconductor element formed on the insulating substrate 25.

The singlecrystalline Si semiconductor element includes a gate electrode 2 formed above the insulating substrate 25; a gate insulating film 3 formed on the gate electrode 2; an active layer 6; and a LOCOS oxide film 7 formed around the active layer 6; and a protective-insulating-interlayer film 21 over the active layer 6 and the LOCOS oxide film 7. The active layer 6 includes a channel region 17, and source/drain regions 4 and 5. The singlecrystalline Si semiconductor element further includes; an interlayer insulating film 43, which is an insulating film formed between the insulating substrate 25 and the gate electrode 2; at least one first metal wiring 42 formed on the upper surface of the interlayer insulating film 43; and a second metal wiring 45, formed on the protective-insulating-interlayer film 21, being connected to the first metal wiring 42.

This method allows creation of the semiconductor device 50 including the second metal wiring 45. Further, by combining the semiconductor substrate 40 with the insulating substrate 25, the semiconductor device 50 is created.

On forming the first metal wiring 42, it is generally required to form a plurality of wiring layers for efficient use of space, in order to increase the integration density of the IC. However, this results from difficulty in providing wiring pattern due to the small element region.

In view of this problem, the semiconductor substrate 40/semiconductor device 50 according to the present embodiment includes at least one first metal wiring 42 formed beneath the planarization insulating film 1; and a second metal wiring 45, formed on the protective-insulating-interlayer film 21, being connected to the first metal wiring 42.

On this account, it is possible to use space on the rear side of the device area, allowing efficient leading of wiring, thereby increasing integration density.

Further, in the semiconductor substrate 40 of the present embodiment, at least one first metal wiring 42 is formed on the planarization insulating film 1, and this metal wiring can be used as an external leading electrode of the source/drain regions 4/5. Note that, in FIG. 9(*g*), the first metal wiring 42 is a single layer, however, it may be provided as a plurality of layers.

Further, according to the semiconductor substrate 40 and the semiconductor device 50 of the present embodiment and the fabrication methods thereof, the first metal wiring 42 is made of a material whose heat-resistant temperature (the lower one of (i) the melting point and (ii) the reaction temperature with Si) is about 500° C. or greater. On this account, the first metal wiring 42 is not fused during the fabrication.

The present invention is not limited to the embodiments above, but may be altered within the scope of the claims. An embodiment based on a proper combination of technical means disclosed in different embodiments is encompassed in the technical scope of the present invention.

As described, in the semiconductor substrate, the semiconductor device, and the fabrication methods of those according to the present embodiment, there is provided an active layer having a channel region, a source region, and a drain region; and the singlecrystalline Si substrate includes at least a part of a device structure not containing a well-structure or a channel stop region. With this arrangement using a singlecrystalline Si, the resulting semiconductor device is superior in performance and less varied in characteristic.

Further, in the present embodiment not providing a conventional well, a channel stop, or a well-contact, the area of the device area is reduced, allowing more dense integration, thereby realizing a highly-dense semiconductor substrate. Further, since the conventional well is omitted, the resistor may be made thinner than the conventional structure using a well. Thus, the semiconductor element can be made as a thin film which can coexist with the TFTs formed from other polycrystalline Si upon formation of the semiconductor device, allowing conduction between the semiconductor element and TFTs through common thin film wiring Further, since the element can be isolated by etching back the Si thin film, which is created as a result of the cleavage, it is possible to ensure the device isolation of the minute singlecrystalline Si device even on the insulating substrate 25, such as a large glass substrate, without highly-accurate photolithography. Further, since the well is omitted, the fabrication process is simplified.

Further, in the present embodiment, the LOCOS oxide film, thicker than the gate insulating film, is formed by surrounding the active layer. This LOCOS oxide film securely ensures the device isolation.

On this account, on fabricating the semiconductor device having a high-performance integration system by forming the non-singlecrystalline Si semiconductor element and the singlecrystalline Si semiconductor element on the large insulating substrate, the process for making the singlecrystalline Si is simplified. Further, the foregoing arrangement provides a semiconductor substrate and a fabrication method thereof, which ensures device isolation of the minute singlecrystalline Si semiconductor element without highly-accurate photolithography, when the singlecrystalline Si semiconductor element is transferred onto the large insulating substrate.

Further, in the semiconductor substrate of the present invention, the source and drain regions of the active layer form a LDD structure.

Therefore, the change in density distribution of impurities in the vicinity of the drain becomes less rapid, and the electric field strength in the vicinity of the drain region is reduced, thereby improving reliability.

Further, in the semiconductor substrate of the present invention, the surface of the insulating film is highly flat by CMP.

On this account, the insulating substrate 25, which is realized by a flat glass substrate or the like, may be bonded to the planarization insulating film 1.

Further, in the semiconductor substrate of the present invention, at least one wiring layer is formed on the insulating film.

This wiring enables conduction with other circuits, power supply etc.

Further, in the semiconductor substrate of the present invention, the LOCOS oxide film has a thickness of not less than 30 nm and not more than 200 nm.

In the present invention, in contrast to a conventional MOSLSI (Large Scale Integrated Circuit) using an oxide film whose thickness is approximately 500 nm (at least 300 nm) or greater, the LOCOS film, which is to be grown to a field region, has a ½ or ⅒ thickness, i.e., approximately 30 nm to 200 nm.

This structure achieves great reduction in time for oxidization, besides the oxidization can be carried out not in a wet method but in a dry method at a practically satisfactory level. Particularly, since the stress due to oxidization in the edge of the oxide film is greatly reduced, the characteristics of the transistor become stable. Further, the thin oxide film helps reduction of Bird's Beak, thus providing a minute device area in the transistor with high accuracy.

Further, in the semiconductor substrate of the present invention, an ion implantation layer is formed in the singlecrystalline Si substrate with a predetermined depth through implantation of one or plural kinds of ion selected from a hydrogen ion group or an inactive element ion group. The predetermined depth is decided according to the desired thickness of the singlecrystalline Si substrate.

With this arrangement, the wafer is cleaved at the ion implantation layer 9 by heat treatment. This structure allows transfer of a thin film device, which can coexist with a non-singlecrystalline Si, onto a large insulating substrate or the like.

Further, in the semiconductor substrate of the present invention, the ion implantation layer formed in the singlecrystalline Si substrate with a predetermined depth is formed in a portion lower than the LOCOS oxide film. On this account, by etching back the surface of the singlecrystalline Si thin film, which became a thin film by cleavage, to the implantation surface of the LOCOS oxide film, the device isolation is ensured. With this arrangement, the leak current is reduced in the resulting device.

Further, in the fabrication method of a semiconductor substrate according to the present invention, the LOCOS oxide film is formed by dry oxidization.

Therefore, it is possible to greatly reduce the stress upon oxidization of ends of the oxide film, thereby obtaining a transistor with stable characteristics.

Further, in the semiconductor device according to the present invention, an upper surface of the active layer is lower than an upper surface of the LOCOS oxide film.

In this arrangement, by etching back the surface of the singlecrystalline Si thin film, which became a thin film by cleavage, to be lower than the upper surface of the LOCOS oxide film, it is possible to form elements which are separated each other. With this arrangement, the leak current is reduced in the resulting device.

Further, in the semiconductor device according to the present invention, both edges of the active layer lie along inclinations of edges of the LOCOS oxide film.

With this configuration, device isolation is ensured in the structure, thereby reducing leak current due to defective edge of Si island and stress in the conventional island etching.

Further, in the semiconductor device according to the present invention, the first wiring layer is made of a material whose heat-resistant temperature is about 500° C. or greater, the heat-resistant temperature being a lower one of (i) a melting point and (ii) a reaction temperature with Si.

On this account, the first wiring layer is not fused in the fabrication.

Further, in the semiconductor device according to the present invention, the singlecrystalline Si semiconductor element is formed in one portion of the insulating substrate, and a non-singlecrystalline Si semiconductor element is formed on another portion of the insulating substrate.

This arrangement allows coexistence of a singlecrystalline Si semiconductor element and a non-singlecrystalline Si semiconductor element on the insulating substrate.

Further, a semiconductor device according to the present invention is arranged so that a part of the singlecrystalline Si semiconductor element constitutes a transistor which controls display of a pixel constituting a display section, and the transistor constituted of the singlecrystalline Si semiconductor element constitutes either a display drive circuit for driving the display section, and/or a processing circuit for outputting a predetermined signal to the display drive circuit, the transistor being monolithically formed on a substrate constituting the display section; further, the transistor is also used as a circuit for constituting the display device.

In the conventional liquid crystal display device or the other conventional displays, switching transistors for the pixels are formed of non-singlecrystalline Si semiconductor elements on the insulating substrate of glass or the like. Then, after the wiring pattern for the transistors are formed, the display drive circuit for driving the display section and/or the processing circuit for outputting predetermined signals to the display drive circuit is provided in the from of COG or COF realized by the singlecrystalline Si semiconductor element, and the circuit is then connected to the wiring pattern, otherwise, the display drive circuit and/or the processing circuit is externally provided from a print board or the like.

However, in the present embodiment, at least a part of the singlecrystalline Si semiconductor element constitutes the switching transistor which controls display of each pixel constituting a display section, and the transistor constituted of the singlecrystalline Si semiconductor element constitutes either a display drive circuit for driving the display section, or a processing circuit for outputting a predetermined signal to the display drive circuit.

On this account, after the part or the whole of the non-singlecrystalline Si semiconductor element and the part of the singlecrystalline Si semiconductor element are formed on the insulating substrate, their conduction is made by a common wiring layer. On this account, it is possible to provide a semiconductor device which realizes a high-quality display device with high productivity.

Further, in the fabrication method of a semiconductor device according to the present invention, before the step (a), surfaces of the semiconductor substrate and the insulating substrate are activated through either washing by cleaning water containing a hydrogen peroxide solution, or by exposure under oxygen-plasma atmosphere.

As a result, the semiconductor substrate and the insulating substrate are bonded by Van der Waals, hydrogen bond or other kinds of coupling, without an adhesive.

Further, in the fabrication method of a semiconductor device according to the present invention, the heat treatment in the singlecrystalline Si substrate removal process is carried out at a temperature ranging approximately from 250° C. to 600° C.

In this method, the singlecrystalline Si semiconductor element is heated to, for example, a temperature at which the hydrogen ion is separated from the Si, thus securing the bonding strength between the semiconductor substrate and the insulating substrate; further, the heat causes the wafer body to be cleaved at the ion implantation layer, detaching a part of the singlecrystalline Si substrate.

The embodiments and concrete examples of implementation discussed in the foregoing detailed explanation serve solely to illustrate the technical details of the present invention, which should not be narrowly interpreted within the limits of such embodiments and concrete examples but rather may be applied in many variations within the spirit of the present invention, provided such variations do not exceed the scope of the patent claims set forth below.

What is claimed is:

1. A fabrication method of a semiconductor substrate, comprising the steps of:
    (i) forming a LOCOS oxide film outside a device area of a singlecrystalline Si substrate;
    (ia) implanting an ion for adjustment of a threshold voltage in a channel region of either N channel or P channel into the device area surrounded by the LOCOS oxide film so as to form an active layer directly adjacent to the singlecrystalline Si substrate without an intervening well, the active layer consisting of the channel region and a rest region except the channel region, the rest region interleaving the channel region and the rest region being a region which is to be changed into a source region and a drain region,
    the channel region, the region which is to be changed into the source region and the region which is to be changed into the drain region being all directly adjacent to the singlecrystalline Si substrate without an intervening well;
    (ii) forming a gate insulating film on the active layer;
    (iia) forming a gate electrode on the gate insulating film;
    (iii) implanting impurity into the rest region so as to change the rest region into the source region and the drain region;
    (iv) forming an insulating film with a flat upper surface over the gate electrode, the gate insulating film, and the LOCOS oxide film; and
    (v) implanting through the insulating film one or plural kinds of ion selected from a hydrogen ion group or an inactive element ion group so as to form an ion implantation layer with a predetermined depth in the singlecrystalline Si substrate.

2. A fabrication method of a semiconductor substrate, comprising the steps of:
    (i) forming a LOCOS oxide film outside a device area of a singlecrystalline Si substrate;
    (ia) implanting an ion for adjustment of a threshold voltage in a channel region of either N channel or P channel into the device area surrounded by the LOCOS oxide film so as to form an active layer directly adjacent to the singlecrystalline Si substrate without an intervening well, the active layer consisting of the channel region and a rest region except the channel region, the rest region interleaving the channel region and the rest region being a region which is to be changed into a source region and a drain region,
    the channel region, the region which is to be changed into the source region and the region which is to be changed into the drain region being all directly adjacent to the singlecrystalline Si substrate without an intervening well;
    (ii) forming a gate insulating film on the active layer;
    (iia) forming a gate electrode on the gate insulating film;
    (iii) implanting impurity into the rest region so as to change the rest region into the source region and the drain region;
    (iv) forming a first insulating film with a flat upper surface over the gate electrode, the gate insulating film, and the LOCOS oxide film;
    (v) implanting through the first insulating film one or plural kinds of ion selected from a hydrogen ion group or an inactive element ion group so as to form an ion implantation layer with a predetermined depth in the singlecrystalline Si substrate;
    (vi) forming at least one first wiring layer above the first insulating film; and
    (vii) forming a second insulating film on the first wiring layer.

3. The fabrication method of a semiconductor substrate as set forth in claim 2, wherein:
    the LOCOS oxide film is formed by dry oxidization.

4. A fabrication method of a semiconductor device, comprising the steps of:
    (a) bonding a semiconductor substrate onto an insulating substrate,
    the semiconductor substrate being fabricated based on a fabrication method of a semiconductor substrate, comprising the steps of:
    (i) forming a LOCOS oxide film outside a device area of a singlecrystalline Si substrate;
    (ia) implanting an ion for adjustment of a threshold voltage in a channel region of either N channel or P channel into the device area surrounded by the LOCOS oxide film so as to form an active layer directly adjacent to the singlecrystalline Si substrate without an intervening well, the active layer consisting of the channel region and a rest region except the channel region, the rest region interleaving the channel region and the rest region being a region which is to be changed into a source region and a drain region,
    the channel region, the region which is to be changed into the source region and the region which is to be changed into the drain region being all directly adjacent to the singlecrystalline Si substrate without an intervening well;
    (ii) forming a gate insulating film on the active layer;
    (iia) forming a gate electrode on the gate insulating film;
    (iii) implanting impurity into the rest region so as to change the rest region into the source region and the drain region;

(iv) forming a first insulating film with a flat upper surface over the gate electrode, the gate insulating film, and the LOCOS oxide film;
(v) implanting through the first insulating film one or plural kinds of ion selected from a hydrogen ion group or an inactive element ion group so as to form an ion implantation layer with a predetermined depth in the single-crystalline Si substrate;
(vi) forming at least one first wiring layer above the first insulating film; and
(vii) forming a second insulating film on the first wiring layer, the fabrication method of a semiconductor device further comprising the steps of:

(b) dividing the singlecrystalline Si substrate at the ion implantation layer by heat treatment so as to detach a part of the singlecrystalline Si substrate;
(c) etching a part of singlecrystalline Si on the insulating substrate so as to expose a surface of the LOCOS oxide film;
(d) forming an interlayer insulating film over the active layer and the LOCOS oxide film; and
(e) forming a second wiring layer on the interlayer insulating film, and connecting the second wiring layer to the first wiring layer.

5. The fabrication method of a semiconductor device as set forth in claim 4, wherein:

before the step (a), surfaces of the semiconductor substrate and the insulating substrate are activated through either washing by cleaning water containing a hydrogen peroxide solution, or by exposure under oxygen-plasma atmosphere.

6. The fabrication method of a semiconductor device as set forth in claim 4, wherein:

in the step (b), the heat treatment is carried out at a temperature ranging approximately from 250° C. to 600° C.

* * * * *